(12) United States Patent
Hinderer et al.

(10) Patent No.: US 11,798,720 B2
(45) Date of Patent: Oct. 24, 2023

(54) SUPERCONDUCTOR MAGNET SYSTEM, WITH INDIVIDUAL TEMPERATURE CONTROL OF AXIALLY STACKED BULK SUB-MAGNETS

(71) Applicant: Bruker Switzerland AG, Faellanden (CH)

(72) Inventors: Joerg Hinderer, Waldshut-Tiengen (DE); Stephen Alfred March, Zurich (CH); Franck Borgnolutti, Duebendorf (CH); Dmitry Eshchenko, Volketswil (CH); Stephan Heiss, Wiesendangen (CH); Pierre-Alain Bovier, Zurich (CH)

(73) Assignee: BRUKER SWITZERLAND AG, Faellanden (CH)

( * ) Notice: Subject to any disclaimer, the term of this patent is extended or adjusted under 35 U.S.C. 154(b) by 196 days.

(21) Appl. No.: 17/317,330

(22) Filed: May 11, 2021

(65) Prior Publication Data

US 2021/0358666 A1 Nov. 18, 2021

(30) Foreign Application Priority Data

May 14, 2020 (EP) .................................. 20174683

(51) Int. Cl.
*H01F 6/00* (2006.01)
*G01R 33/38* (2006.01)
(Continued)

(52) U.S. Cl.
CPC ......... *H01F 6/005* (2013.01); *G01R 33/3804* (2013.01); *G01R 33/3815* (2013.01);
(Continued)

(58) Field of Classification Search
CPC . H01F 6/00; H01F 6/005; H01F 6/006; H01F 6/008; H01F 6/04; H01F 6/06;
(Continued)

(56) References Cited

U.S. PATENT DOCUMENTS 6,169,402 B1 1/2001 Oka et al.
7,859,374 B2 * 12/2010 Iwasa ................. G01R 33/3804
335/297

(Continued)

FOREIGN PATENT DOCUMENTS

DE 199 08 433 C2 6/2003
EP 3492941 A1 6/2019
(Continued)

OTHER PUBLICATIONS

Machine translation of Fukutomi et al. Japanese Patent Document H09-074012 A Mar. 18, 1997 (Year: 1997).*

(Continued)

*Primary Examiner* — Kevin J Comber
(74) *Attorney, Agent, or Firm* — Edell, Shapiro & Finnan, LLC

(57) ABSTRACT

A superconductor magnet system (2) includes a cryostat (4), a superconductor bulk magnet (5), and a cryogenic cooling system (12). The bulk magnet (5) has at least N axially stacked bulk sub-magnets (6a-6c), with N≥3. Between each two axially neighboring bulk sub-magnets, an intermediate body (7a-7b) is arranged. The intermediate bodies (7a-7b) are made from a non-metallic thermal insulator material. The cryogenic cooling system (12) is adapted for independently controlling the temperature of each bulk sub-magnet (6a-6c), and has, for each bulk sub-magnet, a temperature sensor (16a-16c) for sensing the temperature of the respec- (Continued)

tive bulk sub-magnet and an adjustment unit (13a-13c) for adjusting a heating power and/or a cooling power at the respective bulk sub-magnet.

29 Claims, 23 Drawing Sheets

(51) Int. Cl.
*G01R 33/3815* (2006.01)
*H01F 6/04* (2006.01)
*H01F 6/06* (2006.01)

(52) U.S. Cl.
CPC ............ *H01F 6/006* (2013.01); *H01F 6/04* (2013.01); *H01F 6/06* (2013.01)

(58) Field of Classification Search
CPC ........ H01F 13/00; H01F 13/003; H01F 27/36; G01R 33/34023; G01R 33/3804; G01R 33/3815; G01R 33/389; G01R 33/421
USPC ......................................................... 361/141
See application file for complete search history.

(56) References Cited

U.S. PATENT DOCUMENTS

| | | | |
|---|---|---|---|
| 8,228,148 B2 | 7/2012 | Iwasa et al. | |
| 8,948,829 B2 | 2/2015 | Morita et al. | |
| 9,564,262 B2 | 2/2017 | Ito et al. | |
| 9,715,958 B2 | 7/2017 | Schauwecker et al. | |
| 11,527,343 B2 | 12/2022 | March et al. | |
| 2008/0246567 A1* | 10/2008 | Isogami | H01F 6/04 |
| | | | 335/216 |
| 2017/0082707 A1* | 3/2017 | Wikus | H01F 6/06 |
| 2019/0178961 A1* | 6/2019 | Morita | G01R 33/3804 |

FOREIGN PATENT DOCUMENTS

| | | |
|---|---|---|
| JP | 09074012 A * | 3/1997 |
| JP | 2005123231 A * | 5/2005 |
| JP | 5360638 B2 | 12/2013 |
| JP | 2021086927 A | 6/2021 |
| WO | 2016161336 A1 | 10/2016 |
| WO | 2018021507 A1 | 2/2018 |

OTHER PUBLICATIONS

Machine translation of Hirose Japanese Patent Document 2005-123231 A May 12, 2005 (Year: 2005).*

* cited by examiner

Method A     Fig. 5

Method B

SUPERCONDUCTOR MAGNET SYSTEM, WITH INDIVIDUAL TEMPERATURE CONTROL OF AXIALLY STACKED BULK SUB-MAGNETS

CROSS REFERENCE TO RELATED APPLICATIONS

This application claims foreign priority under 35 U.S.C. § 119(a)-(d) to European Patent Application EP20174683.1 filed on May 14, 2020, and the contents of which are incorporated into the present application by reference in their entirety.

FIELD OF THE INVENTION

The invention relates to a superconductor magnet system, comprising
a cryostat having a room temperature bore,
a superconductor bulk magnet, contained in the cryostat and arranged coaxially with the room temperature bore, and
a cryogenic cooling system adapted for cooling the superconductor bulk magnet, wherein the superconductor bulk magnet comprises at least N axially stacked bulk sub-magnets, with N≥3,
wherein the bulk sub-magnets are substantially ring shaped and arranged coaxially with the room temperature bore,
wherein between each two axially neighboring bulk sub-magnets, an intermediate body is arranged,
wherein the intermediate bodies are substantially ring-shaped and arranged coaxially with the room temperature bore,
and the bulk sub-magnets are supported on the intermediate bodies.

BACKGROUND

Such a superconductor magnet system is known from EP 3 492 941 A1.

Superconductors may carry an electrical current at practically no ohmic losses. Superconductors are, for example, used to generate magnetic fields of high strength, in particular for use in nuclear magnetic resonance (=NMR) applications. Superconductors have to be exposed to cryogenic temperatures, though, since superconductivity is only assured below a critical temperature $T_{crit}$, which is specific for the superconductor material. Accordingly, superconductors are typically arranged in a cryostat for thermal insulation.

Common superconductor applications use superconductor lines, such as tape shaped or wire shaped superconductor lines. The superconductor lines may be used directly (for example for current transport) or after having been brought in a desired form, for example by winding coils. In particular, superconductor coils for high field applications are typically made from superconductor lines wound in a solenoid type fashion.

However, superconductor bulk magnets are also known. In this case, a superconducting current circulates inside a piece or stacked pieces of superconductor, with the superconductor bulk magnet in general being of closed ring shape. Such structures are simple and inexpensive to produce, and are often made from high temperature superconductor (=HTS) material.

Superconductor bulk magnets may be loaded by a procedure called "field-cooling", e.g. described in U.S. Pat. No. 7,859,374 B2. For this procedure, the superconductor bulk magnet is disposed inside the charger bore of an electrical charger magnet, and then the charger magnet is turned on and generates a magnetic field while the superconductor bulk magnet's temperature $T_{bulk}$ is still above $T_{crit}$. Then the superconductor bulk magnet is cooled below $T_{crit}$ and becomes superconducting. Subsequently, with $T_{bulk}$ kept below $T_{crit}$, the charger magnet is turned off; accordingly, a current is induced in the superconductor bulk magnet, such that the magnetic flux within the superconductor bulk magnet is maintained. In other words, the superconductor bulk magnet traps the magnetic field in its inside. Then the superconductor bulk magnet may be removed from the charger magnet, and may be transported to a place where the trapped magnetic field may be used.

Superconductor bulk magnets have been proposed for NMR applications, compare DE 199 08 433 C2. For many applications, such as said NMR applications, a high homogeneity of a magnetic field is desirable. However, the typical magnetic field of a superconductor bulk magnet magnetized via the field-cooling process and provided in its superconductor bore has a relatively low homogeneity.

It is well known to use resistive electrical shim coils to correct an inhomogeneous magnetic field during its use, such as during NMR measurements. Typically, the electrical shim coils are arranged in a room temperature bore of a cryostat enclosing the superconductor magnet.

However, shim coils allow only the correction of relatively small field inhomogeneities, since the shim coils become hot when too much electrical current is applied, which damages the shim coils and possibly also a sample, and also strongly affects the quality of an NMR measurement.

In U.S. Pat. No. 9,564,262 B2, an electrical shim coil system within the cryostat of the superconductor bulk magnet is proposed; however then the shim coil system introduces heat into the cryostat, making its operation expensive or possibly overloading the cooling capacity installed at the cryostat. JP 5 360 638 B2 also discloses a superconducting magnetic field generator with a bulk superconductor magnet, with an electric correction coil in the cryostat.

Another common approach is to shape the superconductor bulk magnet in a variety of ways in order to improve the homogeneity of the resulting magnetic field, compare for example U.S. Pat. No. 8,948,829 B2 or U.S. Pat. No. 8,228,148 B2 or again U.S. Pat. No. 9,564,262 B2. Although these approaches improve the magnetic field homogeneity, they are difficult and expensive to put into practice, and their improvement effect is limited. Magnetic field inhomogeneity due to production tolerances cannot be compensated for.

EP 3 492 941 A1 proposes a bulk magnet structure comprising a plurality of axially stacked, ring-shaped bulk bodies of identical outer radial diameter and of different radial thickness. A central bulk body has the smallest radial thickness. Between the bulk bodies, metal planar rings of high thermal conductivity are arranged. The bulk magnet structure is charged by field-cooling in a basic magnetization step. Then in a first temperature adjustment step, the temperature of the bulk magnetic structure is raised to improve the uniformity of the magnetic field distribution, wherein the central bulk body is brought into a fully magnetized state. In a second temperature adjustment step, the temperature of the bulk magnetic structure is lowered.

This procedure allows some redistribution of electric currents within the bulk magnetic structure for magnetic field homogenization, but the achievable current distribution is restricted by the distribution of radial thickness of the ring-shaped bulk bodies, i.e. by a hardware design. Accordingly, compensation of magnetic field inhomogeneity due to production tolerances is rather limited.

SUMMARY

It is an object of the invention to provide a superconductor magnet systems based on a superconductor bulk magnet, with which an increased homogeneity of a generated magnetic field may be achieved in a simply way.

According to one formulation of the invention, this object is achieved by a superconductor magnet system as introduced in the beginning, characterized in that the intermediate bodies are made from a non-metallic thermal insulator material, having a specific thermal conductivity smaller than a specific thermal conductivity of the material of the bulk sub-magnets, and that the cryogenic cooling system is adapted for independently controlling the temperature of each bulk sub-magnet, wherein for each bulk sub-magnet, there is
   a temperature sensor for sensing the temperature of the respective bulk sub-magnet, and
   an adjustment unit for adjusting a heating power and/or a cooling power at the respective bulk sub-magnet.

The inventive superconductor magnet system allows a purposeful setting of the temperature of each bulk sub-magnet of the superconductor bulk system. This, in turn, allows a purposeful magnetic saturation of single or multiple bulk sub-magnets during inductive charging of the superconductor bulk magnet via a charger magnet or after the inductive charging with the charger magnet, and thus a targeted distribution or redistribution of electric currents in the bulk sub-magnets. As a result, with the inventive superconductor magnet system, a highly accurate shaping or reshaping of the magnetic field generated by the superconductor bulk magnet becomes possible, in particular in order to achieve a high magnetic field homogeneity.

Electrical currents in the bulk sub-magnets may be set individually, and the individual setting of electrical currents can be performed in general with any magnet hardware. Magnetic field inhomogeneity caused by production tolerances of magnetic hardware may easily be compensated for; the same applies for characteristics (or behavior) of the bulk sub-magnets deviating from expected characteristics (or behavior). The invention does not require a particularly shaped bulk superconductor magnet or bulk sub-magnets, respectively, and may in particular use simple, inexpensive and compact magnet designs. In particular, the inventive superconductor magnet system works well with a hardware design which would cause magnetic field gradients if a default (basic) electric current distribution on the bulk sub-magnets were applied, such as an axially short superconductor bulk magnet.

The invention may apply a coarse setting of electrical currents during the inductive charging of the superconductor bulk magnet, in particular to compensate for design-intrinsic magnetic field gradients. Further, the invention may apply a fine setting of electrical currents after the inductive charging of the superconductor bulk magnet, by inducing drift in one or a plurality of selected bulk sub-magnets until a desired magnetic field profile has been achieved. The magnetic field profile may be monitored for this purpose during the fine setting.

By arranging intermediate bodies made from a non-metallic thermal insulator material between the bulk sub-magnets, it is possible to thermally largely decouple neighbouring bulk sub-magnets, and to establish stable and fine temperature differences between the bulk sub-magnets. In this way, the saturation magnetization of the bulk sub-magnets (or the corresponding electric current in the bulk sub-magnet) may be set very accurately. Often, temperature differences between neighboring bulk sub-magnets are on the order of 5 K or less, typically 1 K or less, and in many cases 2/10 K or less, during inventive charging or homogenization methods.

The thermal insulator material is typically a plastic material or a composite material including plastic. In other embodiments, the thermal insulator material may include a ceramic material or composite material including ceramics. The specific thermal conductivities may be compared at 50 K. in general, the specific thermal conductivity of the intermediate bodies is lower than the specific thermal conductivity of the bulk sub-magnets by a factor of 2 or more, often a factor 2.5 or more, and preferably a factor or 4 or more.

In order to check the temperature of the bulk sub-magnets, a separate temperature sensor is provided for each bulk sub-magnet.

The adjustment units are used to establish a desired heating power and/or cooling power at each bulk sub-magnet, in order to set the temperature of the bulk sub-magnet in a targeted manner.

The adjustment units are typically controlled by an electronic control unit, applying a control loop for each bulk sub-magnet, for example of PID type, and receiving the signals from the temperature sensors. Typical adjustment units include a heater element and/or an adjustable thermal impedance, in particular linked to a cooling stage.

The main superconductor bulk magnet or the respective bulk sub-magnets are in general made from a high temperature superconductor material, for example of ReBCO type (Re: rare earth element, in particular Eu, Y or Gd) or BSCCO type or of $MgB_2$ type or of pnictide type (compare WO 2016/161336 A1), with $T_{crit}>30$ K, often $T_{crit}>40$ K, and preferably $T_{crit}>77$ K.

The superconductor bulk magnet is substantially of cylindrical (cylinder jacket) shape and has a central (axial) bore, also called superconductor bore; it comprises a plurality of axially stacked bulk sub-magnets.

The bulk sub-magnets are generally each of closed ring shape, to allow for a persistent circular electrical current. The currents in the bulk sub-magnets cause a magnetic field substantially along the axis of the central bore ("z-axis"). The bulk sub-magnets may each be of "classic type", i.e. a one piece ring grown from a melt. Alternatively, the bulk sub-magnets may each comprise a multitude of axial layers and/or radial layers, and may in particular be made of a multitude of stacked ring elements and/or may comprise a circumferential superconductor coating on a tube type carrier body or bodies.

Typically, the superconductor bulk magnet comprises between 3 and 7 bulk sub-magnets, the temperatures of which may be mutually separately controlled.

PREFERRED EMBODIMENTS OF THE INVENTION

In a preferred embodiment of an inventive superconductor magnet system, for each bulk sub-magnet, there is a heater element thermally connected to the respective bulk sub-magnet, in particular wherein the heater element is an electric heater element. Individual heater elements are useful in quickly and accurately setting the temperature of a bulk sub-magnet. Electric heater elements may be built particularly compact and are relatively inexpensive.

In a preferred further development of this embodiment, a respective heater element comprises at least one heater winding wound around the respective bulk sub-magnet. In this way, heat can be introduced into the bulk sub-magnet in a uniform way.

In a particularly preferred embodiment, the bulk sub-magnets are framed radially outside by at least one metallic ring, in particular wherein the at least one metallic ring stretches over the full axial height of the respective bulk sub-magnet. With the metallic ring, temperature gradients within a bulk sub-magnet are minimized, and a (homogenous) equilibrium temperature distribution is established quickly. Heating power and/or cooling power is typically directed into the at least one metallic ring. Note that the metallic ring may also mechanically stabilize the bulk sub-magnet.

In a preferred further development, the at least one heater winding is arranged in a circumferential notch of the metallic ring. In this way, an increase in radial dimensions due to the heater winding may be minimized or even avoided.

In an advantageous embodiment, the intermediate bodies are made of a polyimide material or a glass fiber reinforced plastic material. These materials show a particularly low thermal conductivity at the cryogenic temperatures required by the invention, are mechanically robust and are relatively inexpensive.

An advantageous embodiment provides that the cryogenic cooling system comprises a common cooling stage for all bulk sub-magnets, and that for each bulk sub-magnet, there is a thermal connection from the common cooling stage to the respective bulk sub-magnet, in particular wherein the thermal connection comprises a thermal impedance. This is a simple and compact way to provide the bulk sub-magnets with cooling power. The common cooling stage is thermally coupled to a cryocooler. Typically, the thermal impedance is fixed. However, it may be possible to include an adjustable thermal impedance in the thermal connection.

A preferred further development provides that the cryogenic cooling system comprises a permanently installed first cryocooler, in particular pulse tube cooler, having its cryocooler cold stage inside the cryostat, wherein the cryocooler cold stage is connected via a thermal impedance or via a thermal switch to the common cooling stage, and that the cryostat further comprises a port and supply lines for an external cooling fluid leading from the port to the common cooling stage and back,
in particular wherein the external cooling fluid is supplied by a second cryocooler. The permanently installed first cryocooler is typically used during normal operation for cooling the cooling stage. In contrast, during the charging procedure, the first cryocooler is deactivated, since the stray field of the charger magnet would likely distort its operation; instead, cooling power is provided by the external cooling fluid. The latter is typically provided by a temporarily installed second cryocooler, which typically has a separate auxiliary cryostat.

In a preferred embodiment, a radial thickness of one or more axially inner bulk sub-magnets is equal to or larger than a radial thickness of axially outer bulk sub-magnets, in particular wherein all bulk sub-magnets have an identical outer radius. These designs have been found useful in practice, and they are simple and inexpensive to produce.

Also within the scope of the present invention is a superconductor charging arrangement, comprising
an electric charger magnet with a charger bore, and
an inventive, above described superconductor magnet system, arranged at least partially within the charger bore. With the electric charger magnet, the superconductor bulk magnet may be charged inductively, and the inventive superconductor magnet system allows for a particularly homogenous magnetic field distribution by setting the individual temperatures of the bulk sub-magnets and thus influencing the (maximum, at that time) induced current in each bulk sub-magnet.

Methods with a Preparatory Charging Step

Further within the scope of the present invention is a method for charging a superconductor magnet system, wherein the superconductor magnet system comprises
a cryostat having a room temperature bore,
a superconductor bulk magnet, contained in the cryostat and arranged coaxially with the room temperature bore, and
a cryogenic cooling system adapted for cooling the superconductor bulk magnet, wherein the superconductor bulk magnet comprises at least N axially stacked bulk sub-magnets, with $N \geq 3$,
and wherein the superconductor magnet system is arranged at least partially within a charger bore of an electric charger magnet,
the method comprising a main field cooling step, wherein a charger current of the electric charger magnet is ramped down and the superconductor bulk magnet takes over the charger magnet's magnetic flux and corresponding electric current, wherein main currents are induced in the bulk sub-magnets with relative proportions according to a basic distribution scheme specific for the setup of the superconductor magnet system and the electric charger magnet, and wherein none of the bulk sub-magnets is magnetically saturated during the main field cooling step, characterized in that the cryogenic cooling system is adapted for independently controlling the temperature of each bulk sub-magnet, that in a preparatory charging step, preparatory currents are set in the bulk sub-magnets, with the preparatory currents having relative proportions according to a correction scheme which is different from the basic distribution scheme,
wherein for being able to set the preparatory currents according to the correction scheme, temperatures of at least a part of the bulk sub-magnets are chosen at least temporarily different from each other, and at least temporarily at least a part of the bulk sub-magnets is magnetically saturated during the preparatory charging step,
and that the main field cooling step takes place after the preparatory charging step, such that the preparatory currents and the main currents add up for the respective bulk sub-magnets, wherein a magnetic field profile of the superconductor bulk magnet based on the sum of the preparatory currents and the main currents is more homogenous than a magnetic field profile based on the main currents alone. The method can be applied to an inventive superconductor magnet system as described above. This method allows to establish a magnetic field with a high homogeneity in a sample volume of the superconductor magnet system.

The inventive method suggests to first induce preparatory currents according to a correction scheme in the superconductor bulk magnet or its bulk sub-magnets, respectively; the preparatory currents in the individual bulk sub-magnets are typically small as compared to the main currents (such as 1/50 of the main currents in amplitude or less, for each bulk sub-magnet). Then, in the main field cooling (main charging) step, the main currents according to the basic distribution scheme are induced and add up to the preparatory currents in the bulk sub-magnets. The resulting total currents can establish a highly homogenous magnetic field in a sample volume (which typically has a volume of at least 1 mm$^3$, preferably at least 27 mm$^3$, more preferably at least 1000 mm$^3$) of the superconductor magnet system, even if the main currents according to the basic distribution scheme alone would result in a magnetic field in the sample volume of low homogeneity, for example due to the production tolerances or even due to the originally intended (typically compact and inexpensive) magnet design as such.

In order to determine a suitable correction scheme, typically first the basic distribution scheme is measured alone, wherein the superconductor magnet system undergoes a conventional field cooling (without a preparatory charging step), and the resulting magnetic field profile is measured ("Method Zero"). Then a suitable correction scheme is calculated. Then the superconductor magnet system is charged anew, now applying both the preparatory charging step and the main field cooling step.

Note that for a part of the bulk sub-magnets, the preparatory currents may be zero. Further note that a bulk sub-magnet which is magnetically saturated may be
- a bulk sub-magnet carrying its critical current using its entire cross-section, or
- a bulk sub-magnet with no current carrying capacity at its given temperature and background magnetic field.

It should be noted that during the main field cooling step, the temperature of the superconductor bulk magnet or its sub-magnets, respectively, is in general lower as compared to the preparatory charging step, in order to avoid magnetic saturation during the main field cooling step.

A preferred variant of the above method provides that during the preparatory charging step, while at least two bulk sub-magnets are at different temperatures, the charger current of the electric charger magnet is changed such that preparatory currents are induced in the bulk sub-magnets, wherein during this change of the charger current in the preparatory charging step, at least a first part of the bulk sub-magnets is or becomes magnetically saturated.

Examples for this variant are described as Method A or Method D below. In this variant, during electromagnetic induction in the preparatory charging step, all temperatures may be held constant, what simplifies controlling. By choosing different temperatures for the bulk sub-magnets, it can be achieved that only a part of the bulk sub-magnets is or becomes magnetically saturated, and/or that the bulk sub-magnets become magnetically saturated at different points in time during the preparatory charging step, resulting in a charging deviating from the basic distribution scheme. As soon as magnetic saturation has been reached, a further change of the charger current (which in general keeps its direction of change during the preparatory charging step) does not change the preparatory currents in the magnetically saturated bulk sub-magnets of the first part anymore. It should be noted that in accordance with this variant, a bulk sub-magnet of the first part may be magnetically saturated right from the beginning of changing of the charger current. Note that the direction of change of the charger current in the preparatory charging step may correspond to the direction of ramping down the charger current in the main field cooling step later (see Method A, D), or may be opposite to it. The first part may comprise one or a plurality of bulk sub-magnets.

In a preferred further development of this variant, the first part comprises a plurality of the bulk sub-magnets, wherein at least two bulk sub-magnets of this first part have different temperatures such that they become magnetically saturated at different points in time during the change of the charger current. In this way, preparatory currents of three or more bulk sub-magnets may be individually set in a simple way (note that one of these three bulk sub-magnets may belong to the second part that does not become magnetically saturated, see below). Note that one or more of the bulk sub-magnets of the first part may be magnetically saturated right from the beginning of the change of the charger current. In this case, the beginning of the change of the charger current can be considered as the point of time when these bulk sub-magnets have become magnetically saturated during the change of the charger current.

In another advantageous further development, during this change of the charger current of the preparatory charging step, a second part of the bulk sub-magnets does not become magnetically saturated, and the change of the charger current keeps changing the preparatory currents in the bulk sub-magnets of this second part during the complete change of the charger current in the preparatory charging step. This simplifies setting the preparatory currents, in particular in the second part. The second part may comprise one or a plurality of bulk sub-magnets. The temperatures of the bulk sub-magnets of the second part are generally lower as compared to the first part.

Another preferred variant of the above method provides that the preparatory charging step comprises a first phase and a second phase,
that in the first phase, by changing the charger current of the electrical charger magnet, intermediate currents are induced in the superconductor bulk magnet according to the basic distribution scheme, wherein none of the bulk sub-magnets is magnetically saturated during the first phase,
and that in the second phase, with the charger current held constant, for a first part of the bulk sub-magnets, the respective temperatures of the bulk sub-magnets are ramped up, and during this ramping-up, the bulk sub-magnets of this first part become magnetically saturated, and during further ramping-up the temperatures the respective intermediate currents in the magnetically saturated bulk sub-magnets of this first part are reduced in magnitude down to the preparatory currents. Examples for this variant are described in Method B, Method C2, Method E and Method F below. This variant allows gradual adjustment of the individual temperatures of the bulk sub-magnets, what is particularly useful if during the correction procedure, intermediate magnetic field profiles are repeatedly measured and the individual temperatures are readjusted until a desired magnetic field profile of the superconductor bulk magnet based on the preparatory currents and according to the correction scheme has been achieved; the desired magnetic profile can be established with high accuracy by these iterations then. Note that the direction of change of the charger current in the preparatory charging step in the first phase may correspond to the direction of ramping down the charger current in the main field cooling step later (compare Method B, E, F), or may be opposite to it (Method C2). It should be noted that during the second phase, the intermediate currents of some of the bulk sub-magnets may even become zero. Note that the first part may comprise one or a plurality of bulk sub-magnets.

In a preferred further development of this variant, in the second phase, the respective temperatures of a second part of the bulk sub-magnets are kept low enough such that the bulk sub-magnets of this second part do not become magnetically saturated, wherein during said further ramping-up of the temperatures of the bulk sub-magnets of the first part, magnetic flux and corresponding electric current from bulk sub-magnets of the first part are at least partially taken over by bulk sub-magnets of the second part, increasing in magnitude the intermediate currents in the bulk sub-magnets in this second part to the preparatory currents. This simplifies setting the preparatory currents, in particular in the second part. Note that the second part may comprise one or a plurality of bulk sub-magnets.

In another advantageous further development, the first part comprises at least two bulk sub-magnets whose temperatures are ramped up with different gradients, such that they become magnetically saturated at different points in time. In this way, preparatory currents of three or more bulk sub-magnets may be individually set in a simple way. An example for this is described in Method E below.

In another preferred variant, during the preparatory charging step, an intermediate magnetic field profile of the superconductor bulk magnet is repeatedly measured, and temperatures of the bulk sub-magnets and/or the charger current are repeatedly changed, until a desired magnetic field profile of the superconductor bulk magnet based on the preparatory currents and according to the correction scheme has been achieved. By these iterations, the desired magnetic field profile may be established with high accuracy. An example for this variant is described in Method D below.

In another advantageous variant, a magnetic field profile of the superconductor bulk magnet based on the preparatory currents is asymmetric with respect to a magnetic center of the superconductor bulk magnet. In this way, magnetic field gradients of odd order may be compensated for. Examples for this variant are described in Method E and Method G below.

Methods with a Posterior Correction Step

Further within the scope of the present invention is a method for homogenizing a magnetic field profile of a superconductor magnet system,
wherein the superconductor magnet system comprises
   a cryostat having a room temperature bore,
   a superconductor bulk magnet, contained in the cryostat and arranged coaxially with the room temperature bore, and
   a cryogenic cooling system adapted for cooling the superconductor bulk magnet, wherein the superconductor bulk magnet comprises at least N axially stacked bulk sub-magnets, with $N \geq 3$,
wherein in an initial state, the bulk sub-magnets carry respective initial currents with relative proportions according to an initial distribution scheme,
and the method comprises a posterior correction step which changes the initial currents into final currents with relative proportions according to a final distribution scheme which is different from the initial distribution scheme,
wherein a magnetic field profile of the superconductor bulk magnet based on the final currents is more homogenous than a magnetic field profile based on the initial currents, characterized in
that the cryogenic cooling system is adapted for independently controlling the temperature of each bulk sub-magnet, and that for changing the initial currents into the final currents, temperatures of at least a part of the bulk sub-magnets are chosen at least temporarily different from each other, such that
   for a first part of the bulk sub-magnets, the bulk sub-magnets of this first part are at least almost magnetically saturated, in particular with at least 99% relative magnetic saturation, and
   for a second part of the bulk sub-magnets, the bulk sub-magnets of this second part are significantly away from magnetic saturation, in particular with at most 99% relative magnetic saturation, preferably with at most 95% relative magnetic saturation.

An example for this method is described in Method I below. The method can be applied to an inventive superconductor magnet system as described above. This method allows to establish a magnetic field with a very high homogeneity in a sample volume of the superconductor magnet system.

With a first part of the bulk sub-magnets at at least almost magnetic saturation, energy of the bulk sub-magnets in this first part slowly dissipates and weakens their contribution to the magnetic field profile; due to coupling some of the magnetic flux (and respective electric current) is typically taken over by other (non-saturated) bulk sub-magnets in the second part.

This effect is used for slowly adjusting the magnetic field profile, and in particular to homogenize it. With their individual temperature control, bulk sub-magnets may be freely chosen for weakening their respective field contribution.

Typically, only one bulk sub-magnet or two bulk sub-magnets which are symmetric with respect to the magnetic center are brought to at least almost magnetic saturation at a time. During the posterior correction step, the allocation of bulk sub-magnets to the first part or second part may change over time.

In a preferred variant of this method, the temperatures of the bulk sub-magnets of the first part are at least temporarily higher than the temperatures of the bulk sub-magnets of the second part. In this way, the bulk sub-magnets of the first part may be brought to at least almost magnetic saturation in a simple way, whereas the bulk sub-magnets of the second part are not.

In an advantageous variant, during the posterior correction step, an intermediate magnetic field profile is repeatedly measured until a desired magnetic field profile based on the final currents is obtained, wherein between measurements, temperatures of the bulk sub-magnets are changed and/or some time is waited. By the iterations of this variant, a particularly high homogeneity of the final magnetic field may be achieved.

Another variant provides that for assuming the initial state in a main field cooling step, the superconductor magnet system is arranged at least partially in a charger bore of an electrical charger magnet, and a charger current of the electric charger magnet is ramped down and the superconductor bulk magnet takes over the charger magnet's magnetic flux and corresponding electric current. In other words, the initial state is prepared by a field cooling step, which is a simple way to initially load the superconductor bulk magnet.

Further, in a preferred variant of the method with the posterior correction step, the method with the posterior correction step is preceded by an above described inventive method with a preparatory correction step. In this way, a particularly high homogeneity of the final magnetic field can be achieved.

Further within the scope of the present invention is the use of an inventive, above described superconductor magnet system, or of a superconductor magnet system charged by an inventive method with a preparatory charging step described above, or of a superconductor magnet system with a magnetic field profile homogenized by an inventive method with a posterior correction step described above, in nuclear magnetic resonance measurements. In nuclear magnetic resonance (=NMR) experiments, the high homogeneity of the magnetic field that can be achieved according to the invention is particularly advantageous for obtaining a high measuring resolution.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

DETAILED DESCRIPTION

Figure 1:
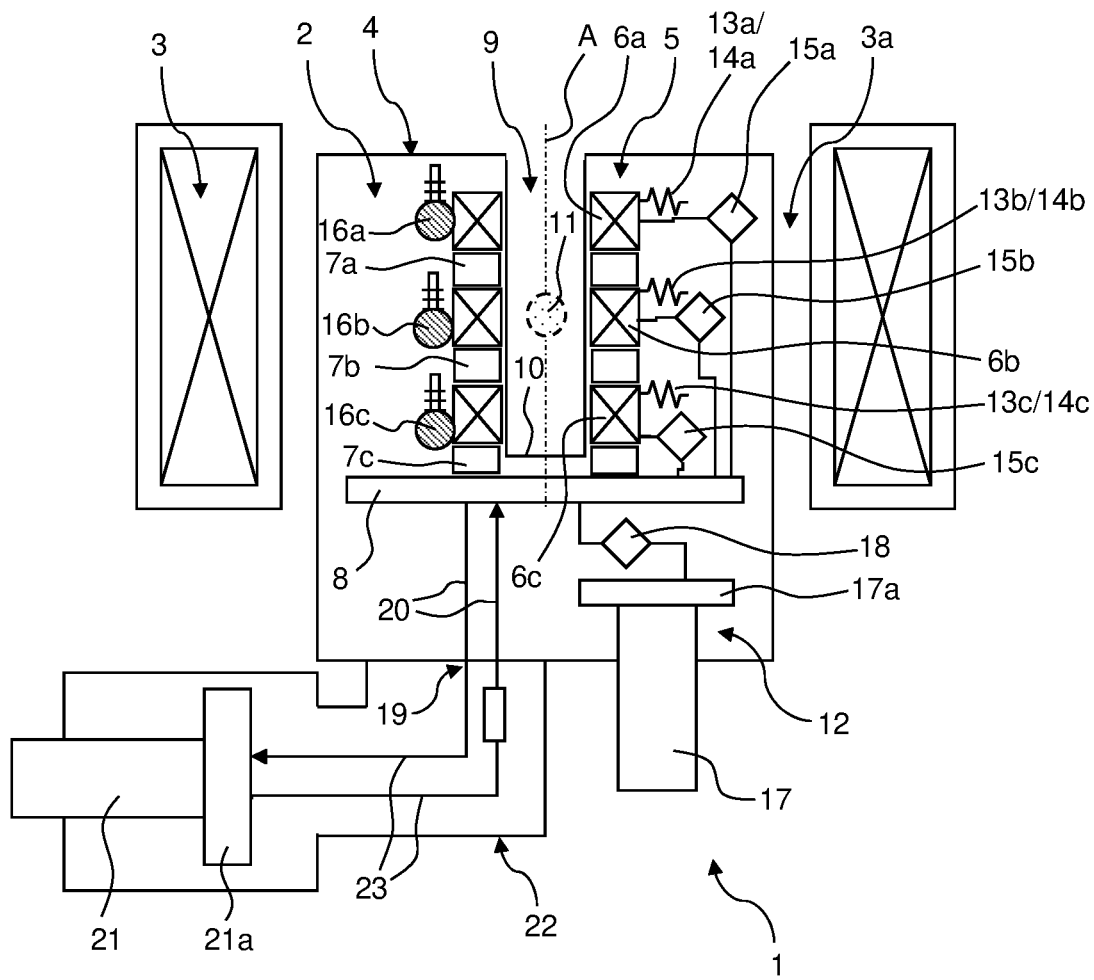
FIG. 1 shows a schematic view of an embodiment of a superconductor charging arrangement according to the invention by way of example.

FIG. 1 shows in a schematic view a superconductor charging arrangement 1 according to an embodiment of the invention, comprising an inventive superconductor magnet system 2, arranged partially within a charger bore 3a of an electric charger magnet 3.

The electric charger magnet 3 may be of superconducting type or normally conducting type, and an electric charger current running within the charger magnet 3 may be set with an electronic control, not shown in detail. With the charger magnet 3, a magnetic flux (or magnetic field) may be generated within the charger bore 3a, for the purpose of inductively charging the superconductor magnet system 2. The generated magnetic flux is oriented in general parallel to a central axis A.

The superconducting magnet system 2 comprises a cryostat 4, inside of which a vacuum is maintained for thermal insulation. Inside the cryostat 4, there is contained a superconductor bulk magnet 5, comprising here three bulk sub-magnets 6a, 6b, 6c. The bulk sub-magnets 6a-6c are generally of a closed ring shape, and are arranged axially stacked and coaxially with respect to the central axis A of the superconductor magnet system 2. This results in an axially extending free space radially central inside the superconductor bulk magnet 5, called the superconductor bore 9. The bulk sub-magnets 6a-6c are made of a high temperature superconductor material, such as YBCO. Axis A is also called the z axis.

Axially between neighboring bulk sub-magnets 6a-6c, there are arranged substantially ring-shaped, washer-like intermediate bodies 7a, 7b, made here of polyimide material, for thermally insulating the bulk sub-magnets 6a-6c against each other. A further intermediate body 7c of polyimide material is located between the bottom bulk sub-magnet 6c and a common cooling stage 8 for the bulk sub-magnets 6a-6c. The bulk sub-magnets 6a-6c rest upon the intermediate bodies 7a-7b and the further intermediate body 7c.

In the example shown, the bulk sub-magnets 6a-6c all have an identical outer diameter and have an identical inner diameter. Further, in the example shown, the intermediate bodies 7a-7b (and here also the further intermediate body 7c) have the same outer diameters and inner diameters as the bulk sub-magnets 6a-6c.

A room temperature bore 10 of the cryostat 4 reaches into the superconductor bore 9. The charger magnet 3 or its charger bore 3a, the superconductor bulk magnet 5 or its superconductor bore 9, and the room temperature bore 10 are arranged coaxially. At a magnetic center of the superconductor bore 9 and within the room temperature bore, there is located a sample volume 11, at which a sample may be arranged which is to be exposed to the magnetic flux generated by the superconductor magnet system 2.

The superconductor magnet system 2 further comprises a cryogenic cooling system 12 for cooling the superconductor bulk magnet 5. According to the invention, the temperature of each bulk sub-magnet 6a-6c may be individually set, typically with an accuracy of at least 0.1 K, or even better. For this purpose, for each bulk sub-magnet 6a-6c, there is an adjustment unit 13a-13c for adjusting here a heating power to the respective bulk sub-magnet 6a-6c. In the example shown, a respective adjustment unit 13a-13c is embodied by an electric heater element 14a-14c, the heating power of which may be adjusted by setting an electric current strength. Each heater element 14a-14c is thermally coupled to one of the bulk sub-magnets 6a-6c.

Further, each bulk sub-magnet 6a-6c is thermally coupled to the common cooling stage 8 via a thermal impedance 15a-15c. The common cooling stage 8 is, during the charging procedure and during normal operation, at a cryogenic temperature in general far below the critical temperature of the material of the bulk sub-magnets 6a-6c. This provides constantly a cooling power to the bulk sub-magnets 6a-6c. It should be noted that the thermal impedances 15a-15c are typically of fixed type. Alternatively, the thermal impedances may be of adjustable type, then being part of the respective adjustment unit 13a-13c. For reaching a stable temperature at a specific bulk sub-magnet 6a-6c, the set heating power of the heater element 14a-14b, the opposing (effective) cooling power of the common cooling stage 8 and further heat conduction paths (such as black body radiation and remaining thermal conduction through the intermediate bodies 7a, 7b and the further intermediate body 7c) are brought to equilibrium.

Further, each bulk sub-magnet 6a-6c is equipped with a temperature sensor 16a-16c, for monitoring the temperature of the respective bulk sub-magnet 6a-6c. A typical temperature sensor 16a-16c includes a thermocouple, for example of NiCr—Ni type.

The adjustment units 13a-13c and the temperature sensors 16a-16c are connected to an electronic control unit (not shown in detail) for controlling the temperatures of the bulk sub-magnets at least during the charging of the superconductor bulk magnet 5.

In order to cool the common cooling stage 8 during the normal operation, in the example shown, the cryostat 4 is permanently equipped with a first cryocooler 17, having its cryocooler cold stage 17a inside the cryostat 4. The cryocooler cold stage 17a of the first cryocooler 17 is connected here via a thermal impedance 18 to the common cold stage 8.

During the charging procedure, operation of the first cryocooler 17 may be impaired by strong magnetic stray fields originating from the charger magnet 3, and should not be used then.

Therefore, the cryostat 4 further comprises a port 19 and supply lines 20 for leading an external cooling fluid from the port 19 to the common cooling stage 8 and back. During the charging procedure, the port 19 is temporarily connected to an external, second cryocooler 21, whose cryocooler cold stage 21a is arranged in a separate auxiliary cryostat 22.

Inside this auxiliary cryostat 22, auxiliary supply lines 23 for transporting the cooling fluid run from the cryocooler cold stage 21a of the second cryocooler 21 to the port 19 and back. Further it should be noted that during normal operation, typically less cooling power is needed as compared to the charging procedure, and so by using the second cryocooler 21 during the charging procedure, a smaller first cryocooler for normal operation can be used.

It should be noted that in other embodiments, the cooling system 12 can be built differently, e.g. without including the first cryocooler, and only having the second cryocooler.

Figure 2:
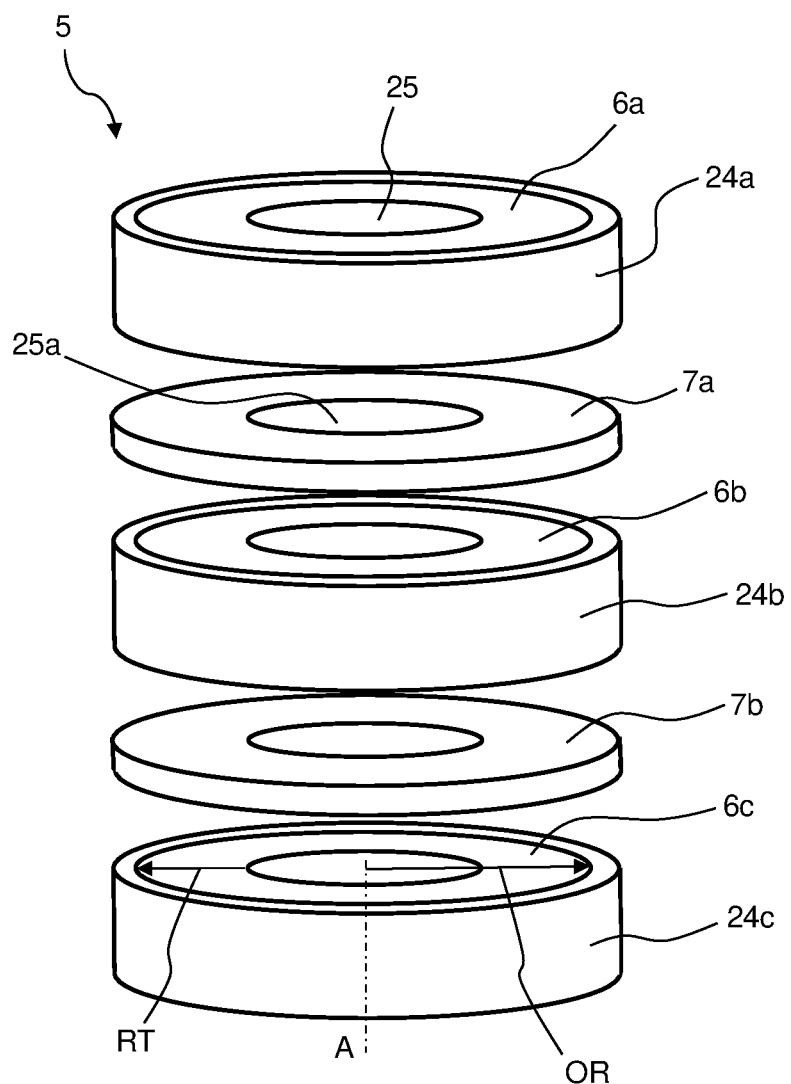
FIG. 2 shows a schematic explosion view of an embodiment of a superconductor bulk magnet according to the invention by way of example.

FIG. 2 shows in a schematic explosion view an embodiment of a superconductor bulk magnet 5 for the invention by way of example. Note that in practice, the bulk sub-magnets 6a-6c and the intermediate bodies are touching each other in axial direction, and in normal operation, magnetic forces press the bulk sub-magnets 6a-6c axially together with a few tons equivalent of magnetic pressure.

In the example shown, the superconductor bulk magnet 5 comprises three bulk sub-magnets 6a-6c, roughly of cylinder ring shape each with a central hole 25, and axially separated by intermediate bodies 7a, 7b, having basically a washer shape, likewise each having a central hole 25a. The holes 25, 25a have identical diameters here. The bulk sub-magnets 6a-6c and the intermediate bodies are axially stacked, and arranged coaxially with the central axis A. In the example shown, all bulk sub-magnets 6a-6c are of identical type, with identical dimensions and made of the same high temperature superconductor material, and in particular having the same radial thickness RT and the same outer radius OR. Likewise, the intermediate bodies 7a, 7b are of identical type, with identical dimensions and made of the same polyimide material.

The bulk sub-magnets 6a-6c here are framed with a radially outer metallic ring 24a-24c, which provides mechanical stability ("corset ring") and also a quick axial thermal conduction path for each bulk sub-magnet 6a-6c, so temperature gradients are minimized within each of the bulk sub-magnets 6a-6c. Typical materials of the metallic rings 24a are stainless steel and high-strength aluminum alloys. The metallic ring 24a-24c stretches over the full axial height of each bulk sub-magnet 6a-6c. The outer diameters of the metallic rings 24a-24c and of the intermediate bodies 7a, 7b are identical here.

It should be noted that an inventive superconductor bulk magnet 5 may have more than three bulk sub-magnets, such as five or seven bulk magnets (not shown). In general, an odd number of bulk sub-magnets is preferred, though.

Figure 3:
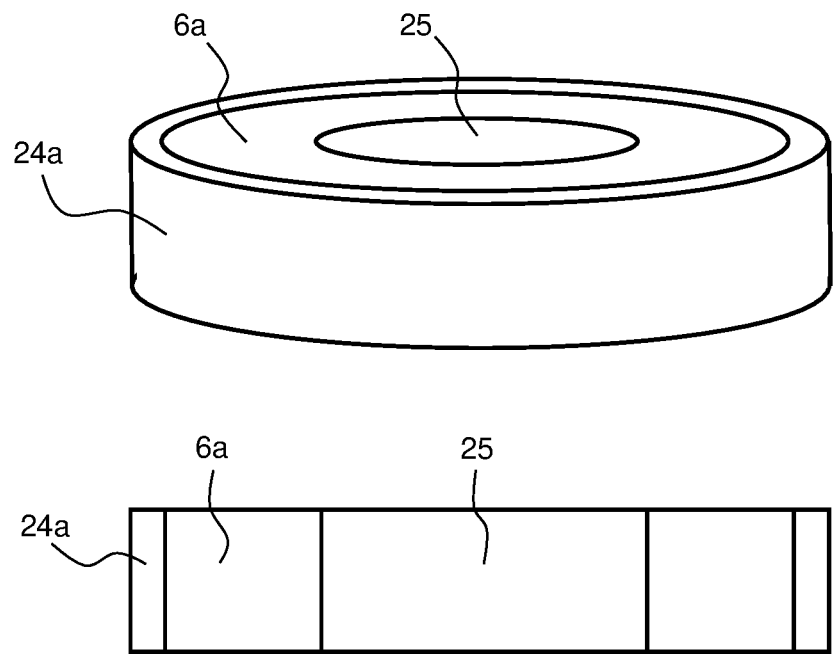
FIG. 3 shows a schematic perspective view (top) and cross-section (bottom) of a bulk sub-magnet with an encompassing metallic ring, by way of example, for the invention.

FIG. 3 illustrates once again a bulk sub-magnet 6a as shown in FIG. 2, with its metallic ring 24a in perspective view (top) and in a schematic cross-section (bottom). Through the hole 25, the room temperature bore or the corresponding cryostat tubing will extend.

Figure 4:
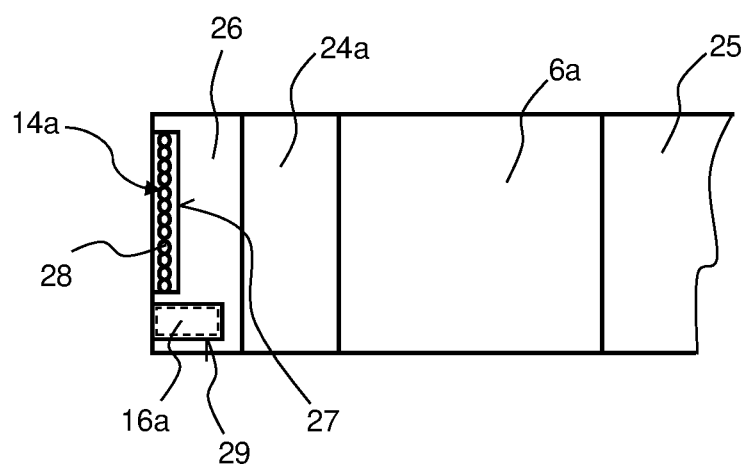
FIG. 4 shows a schematic cross-section of a bulk sub-magnet with a corset ring and a support ring, by way of example, for the invention.

In a variant of a bulk sub-magnet 6a illustrated in the schematic cross-section of FIG. 4, there is a further metallic ring 26 ("support ring") encasing the metallic ring 24a radially outside. The further metallic ring can be made of aluminium or another diamagnetic metal. The further metallic ring 26 has a circumferential notch 27, in which an electric heater element 14a is arranged, with a plurality of heater windings 28 wound about the further metallic ring 26. The heating wire of the heater element 14a may be wound bifilar, in order to avoid introduction of unwanted distorting magnetic fields by the heating current. The thermal conductivity of the further metallic ring smoothes the temperature distribution in axial direction within the bulk sub-element 6*a*, and heat introduction form the heater element 14*a* is basically uniform.

Further, the further metallic ring 26 has a recess 29 for housing a temperature sensor 16*a*, such as a thermocouple.

Methods for Charging a Superconductor Magnet System Including a Preparatory Charging Step FIGS. 5 through 18 illustrate some exemplary variants (called Methods A, B, C2, D, E, F and G here) for charging a superconductor magnet system in accordance with the invention, such as a superconductor magnet system in a charging arrangement illustrated in FIGS. 1 through 4, including a preparatory charging step. In each case, the respective first figure (see FIGS. 5, 7, 9, 11, 13, 15 and 17) illustrates (plotted to the top) as a function of time (plotted to the right):

The charger current I ch (both in overview, top diagram, and in magnification, second to top diagram);

The induced electric currents I bulks in the bulk sub-magnets (both in overview, third to top diagram, and in magnification, fourth to top diagram); and The temperatures T bulks of the bulk sub-magnets (both in overview, second to bottom diagram, and in magnification, bottom diagram).

Various points in time are marked with letters A through M, for convenient reference. The respective second figure (see FIGS. 6, 8, 10, 12, 14, 16 and 18) in each case illustrates (plotted to the top) as a function of z position (plotted to the right):

The magnetic flux densities B, as generated by the upper, mid and lower bulk sub-magnet as well as generated by the entirety of all bulk sub-magnets ("total") at points of time at 300 min (position G) and/or at 390 min (position I). In the illustrated variants, the superconductor bulk magnet comprises three bulk sub-magnets.

Method A

Figure 5:
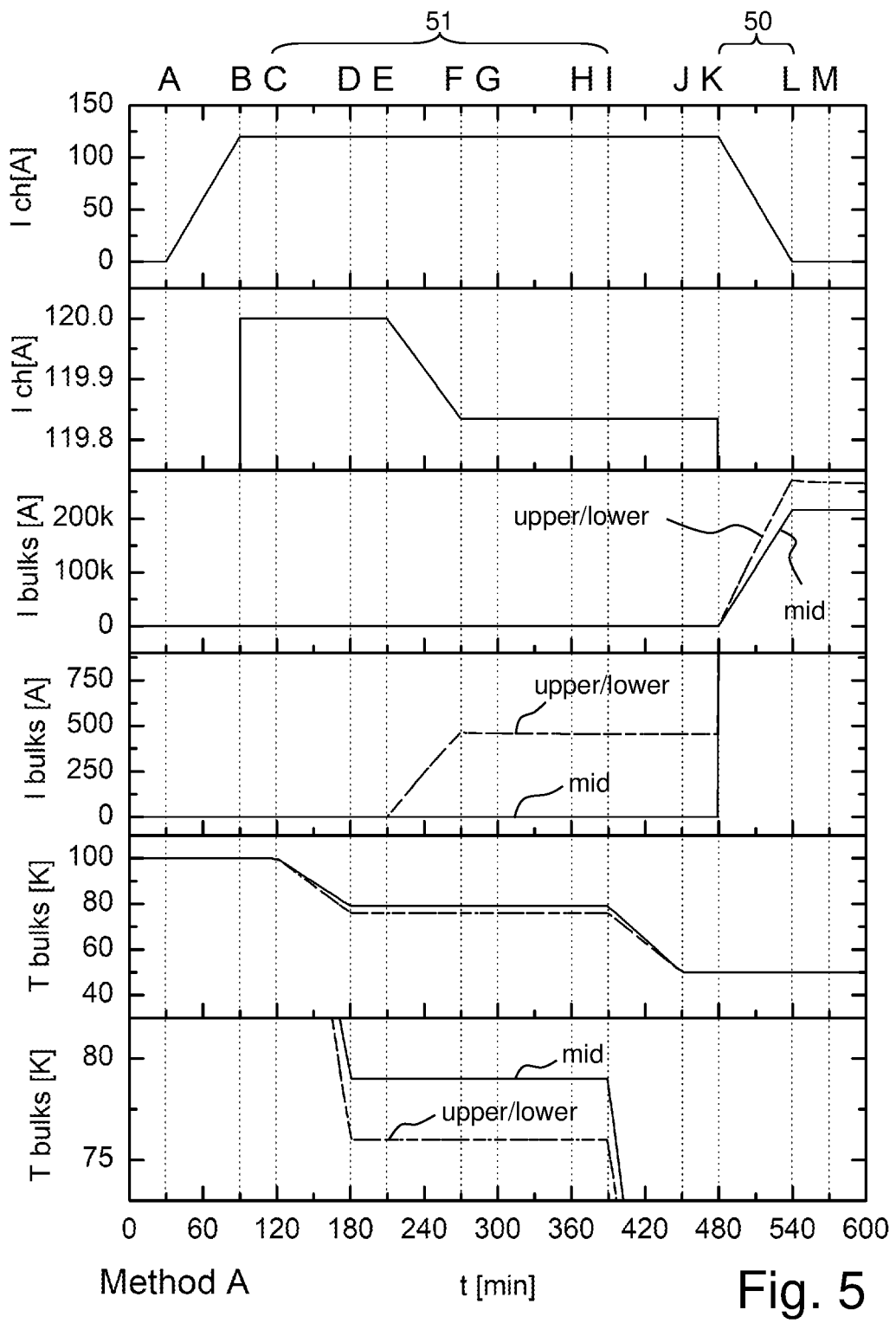
FIG. 5 shows a schematic time schedule for a variant of an inventive method for charging a superconductor magnet system (Method A)

In Method A illustrated in FIG. 5, in time interval A-B, the charger magnet is ramped up to a charger current I ch of about 120 A (Ampere), with the bulk sub-magnets being at a temperature of about 100 K, i.e. above their Tcrit which is at about 92 K, so the bulk sub-magnets remain uncharged. After a waiting interval B-C, the temperature T bulks of the bulk sub-magnets is lowered below Tcrit in interval C-D, for the mid bulk sub-magnet to about 79 K, and for the upper and lower bulk sub-magnet to about 76 K.

After waiting interval D-E, in subsequent time interval E-F, the charger current I ch is slightly lowered, from 120.0 A to about 119.84 A. This induces some current in the upper and lower (i.e. the axially outside) bulk sub-magnets of about 500 A; these bulk sub-magnets may carry this current due to their relatively low temperature, even with the background magnetic field of the charger magnet. On the other hand, in the mid bulk sub-magnet, practically no electric current is induced, since its current carrying capacity is negligible due to its relatively high temperature and the already present background magnetic field of the charger magnet. After the relaxation in time interval F-G, i.e. at time point G (at 300 min), the bulk sub-magnets have received their preparatory currents according to a correction scheme.

After further waiting here until time point I, the temperature T bulks of the bulk sub-magnets is lowered to about 50 K, which is the intended temperature for the main field-cooling (main charging step), over time interval I-J. A temperature of 50 K is low enough such that no magnetic saturation will occur during the main field cooling step. After waiting time interval J-K, in the course of the main field-cooling step in time interval K-L, the charger current I ch is lowered to zero, what induces the main currents according to the basic distribution scheme. The main currents add up to the preparatory currents, and the resulting sum currents generate a magnetic field profile in a sample volume of the superconductor magnet system of high homogeneity, in particular higher as compared a magnetic field profile generated by the main currents alone. After the waiting time interval L-M, method A is finished.

It should be noted that the time interval K-L can be considered the main field cooling step 50, and time interval C-I can be considered the preparatory charging step.

In Method A, temperatures of the bulk sub-magnets may be set in advance in time interval C-D, before the induction in time interval E-F. If desired, by setting the temperatures of the bulk sub-magnets, all bulk currents may be limited by magnetic saturation. If at least one bulk sub-magnet remains magnetically non-saturated (as shown), then the amplitude of the change of the charger current sets the preparatory current for this bulks sub-magnet.

Figure 6:
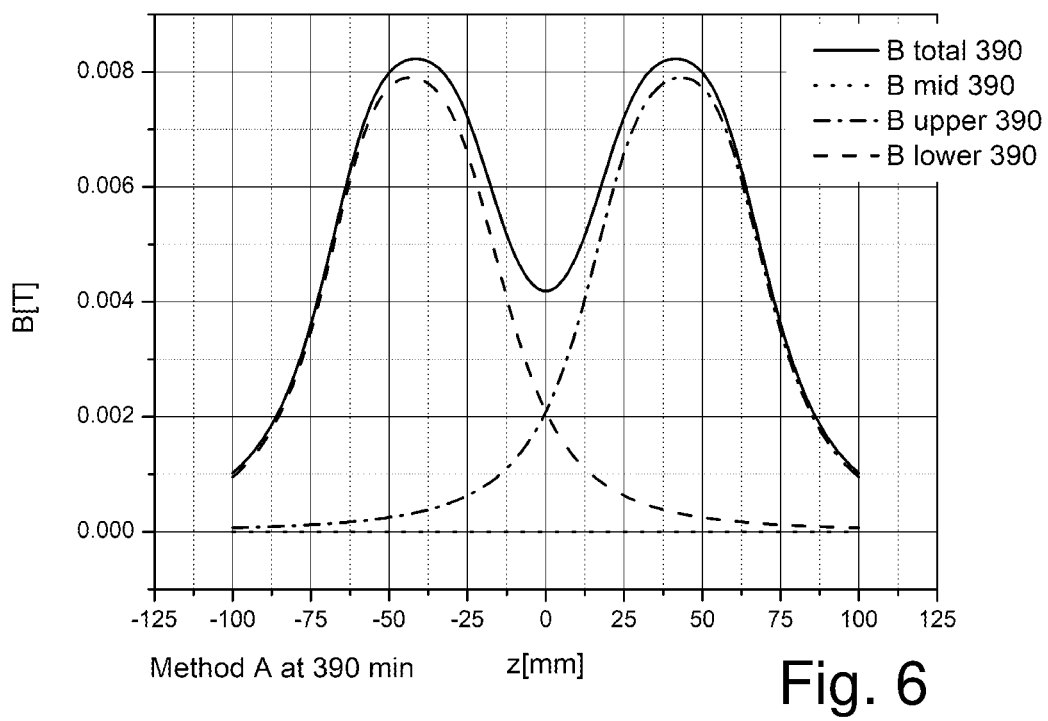
FIG. 6 illustrates schematically magnetic field contributions relating to the Method A.

In FIG. 6, the contributions of the individual bulk sub-magnets to the total magnetic flux in the sample volume are illustrated. In Method A, at time point I at 390 min (illustrating the situation with the preparatory currents induced only), the upper and lower bulk sub-magnets cause a double-hump like magnetic field profile; this will compensate for a too high magnetic field contribution of the mid sub-bulk in the basic distribution scheme of the main field cooling step (see also FIG. 21 below).

In the following, above all the main differences of Methods B through G with respect to Method A are explained.

Method B

Figure 7:
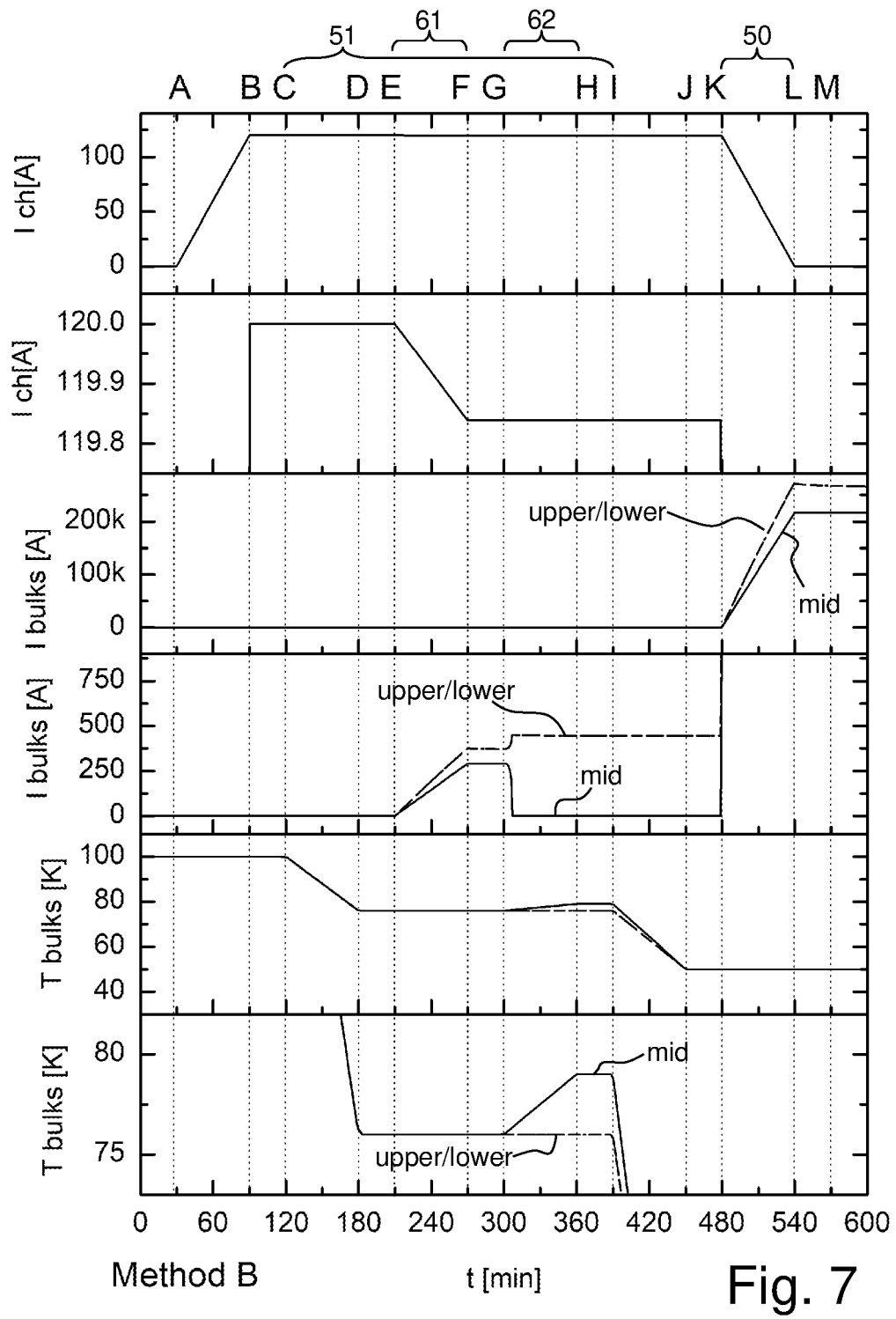
FIG. 7 shows a schematic time schedule for a variant of an inventive method for charging a superconductor magnet system (Method B)

In Method B, illustrated in FIG. 7, in time interval A-B again the charger current I ch is ramped up to about 120 A again, with the bulk sub-magnets at a temperature T bulks of about 100 K.

In time interval C-D, the temperature of the bulks is lowered uniformly to about 76 K. In time interval E-F, the charger current I ch is slightly lowered from 120.0 A to about 119.84 A, what induces some low currents I bulks in the bulk sub-magnets, namely about 380 A in the upper and lower bulk sub-magnet, and about 300 A in the mid sub-magnet, at time point F ("intermediate currents"). Time interval E-F is also called the first phase 61 of the preparatory charging step 51.

Then, after waiting time interval F-G, in time interval G-H, the temperature of the mid bulk sub-magnet is slightly increased from 76 K to about 79 K, whereas the temperature of the upper and lower bulk sub-magnets remains at about 76 K. When the temperature of the mid bulk sub-magnet arrives at about 76.5 K, its superconducting current carrying capacity is reached, and further temperature increase leads to a complete collapse of its current carrying capacity, and its current I bulk drops to zero. In contrast, by induction, the upper and lower bulk sub-magnets partially take over the magnetic flux of the mid bulk sub-magnet or the corresponding current, such that the induced electric current I bulk of the upper and lower bulk sub-magnet increases from 380 A to about 450 A. Time interval G-H is also called the second phase 62 of the preparatory charging step 51. After the waiting time interval H-I, at time point I, the preparatory currents have been set.

In time interval I-J, the temperatures T bulks of the bulk sub-magnets are lowered to about 50 K, and in time interval K-L, the charger current is ramped down to zero, in the course of the main field cooling step.

In Method B, for a part of the bulk sub-magnets more current is induced in time interval E-F than finally desired as preparatory current. Therefore, some current is "heated out" and redistributed among the remaining part of the bulk sub-magnets.

Figure 8:
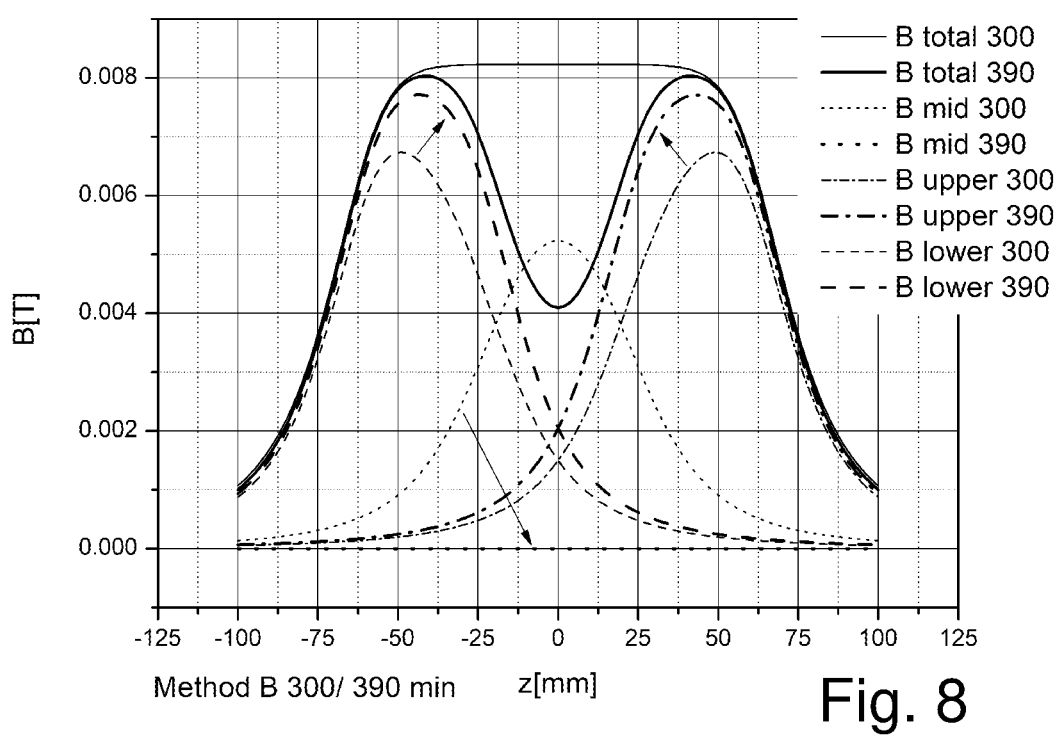
FIG. 8 illustrates schematically magnetic field contributions relating to the Method B.

As can be seen from FIG. 8, at time point G (at 300 min), all three bulk sub-magnets still have comparable magnetic field contributions, corresponding to the basic distribution scheme still. However, after having changed the temperatures, at time point I (at 390 min), the mid bulk sub-magnet has no magnetic field contribution any more, and the field contributions of the upper and lower bulk sub-magnet have increased. The total magnetic field at 390 min has again a double hump like profile, in order to compensate for a too strong field contribution of the mid bulk sub-magnet in the basic distribution scheme.

Method C2

Figure 9:
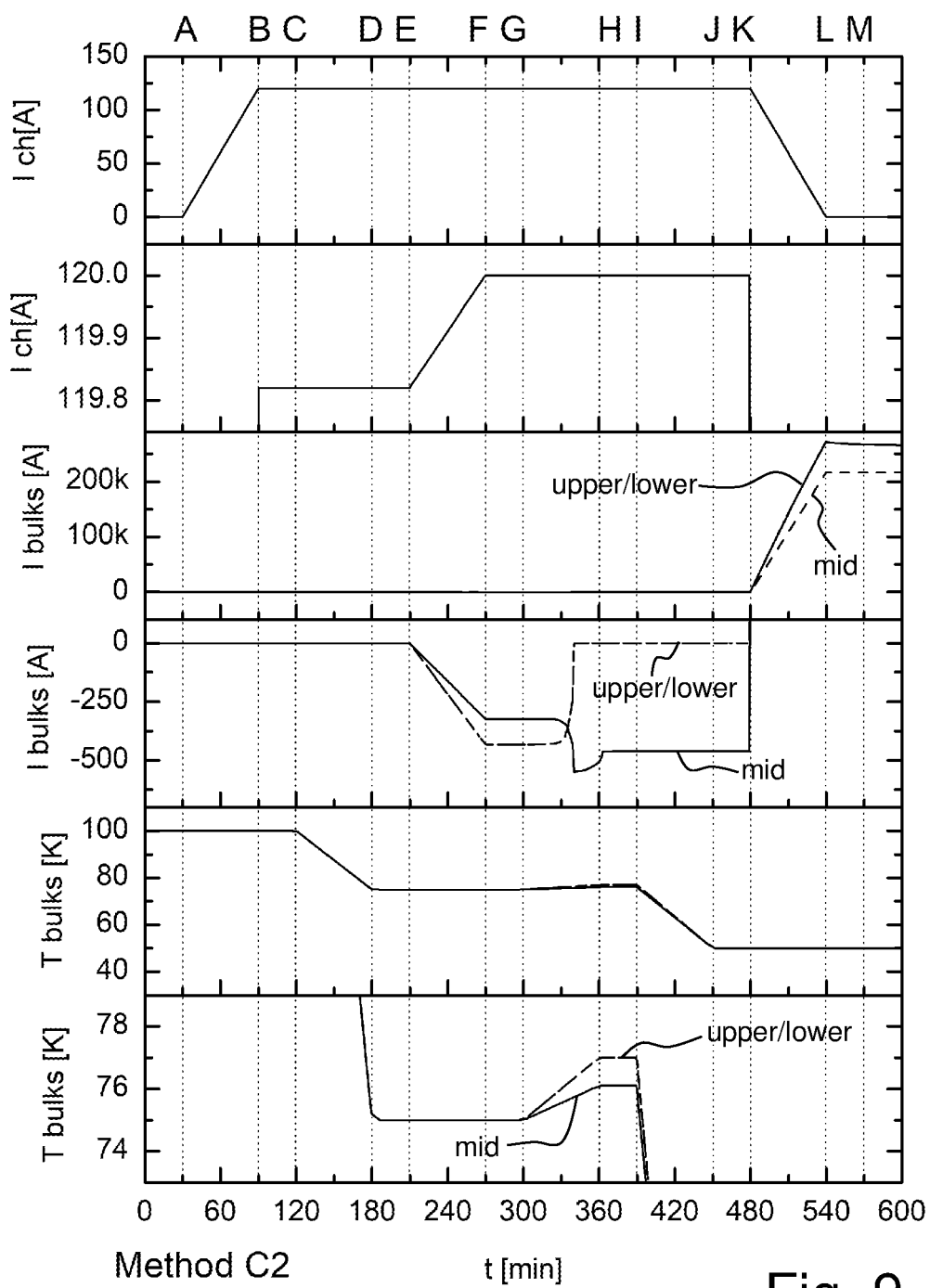
FIG. 9 shows a schematic time schedule for a variant of an inventive method for charging a superconductor magnet system (Method C2)

In the variant of Method C, illustrated in FIG. 9, the charger current I ch is raised only to about 119.84 A here during time interval A-B when the bulk sub-magnets are still at temperatures T bulks of about 100 K. Then in time interval C-D, the temperatures T bulks of the bulk sub-magnets are decreased uniformly to about 75 K, where they have some current carrying capacity at the present background magnetic field of the charger magnet.

Then, in time interval E-F, the charger current I ch is slightly increased from 119.84 A to 120.0 A, what induces some currents I bulks in the bulk sub-magnets, albeit with a negative sign as compared to method B. The bulk current I bulk of the mid bulk sub-magnet assumes about −300 A, and the bulk current I bulk of the upper and lower bulk sub-magnets assume about −450 A each.

Then, in time interval G-H, the temperatures T bulks of the bulk sub-magnets are increased. The upper and lower bulk sub-magnets rises from 75 K to about 77K, and the mid bulk sub-magnets rises form 75 K to about 76.2 K, so different temperature gradients are applied. When the temperature of the upper and lower bulk sub-magnets arrives at about 76.5 K, the upper and lower bulk sub-magnets become magnetically saturated, so that their current carrying capacity is reached; further increase in temperature causes their current carrying capacity to complete collapse, and the bulk current I bulk of the upper and lower bulk sub-magnets drops in magnitude to zero. In contrast, the mid bulk sub-magnet takes over some magnetic flux and corresponding current from the upper and lower bulk sub-magnet, and the bulk current I bulk of the mid bulk sub-magnet increases in magnitude from −300 A to about −480 A (note that there is some overshooting current in the mid bulk sub-magnet, which quickly relaxes, though). At time point I, the preparatory current distribution is obtained.

Then, in time interval I-J, the temperatures of all bulk sub-magnets are lowered to about 50 K, and in time interval K-L, the charger current Ich is ramped down to zero, inducing the main currents. The preparatory currents add up to the main currents, so by Method C2, a lowered total current of the mid bulk sub-magnet can be established, since the adding up of the main current starts at a negative level for the mid bulk sub-magnet.

In Method C2, during induction in time interval E-F the direction of current change of the charger current I ch is opposite to the direction of current change in the main field cooling step in time interval K-L.

Figure 10:
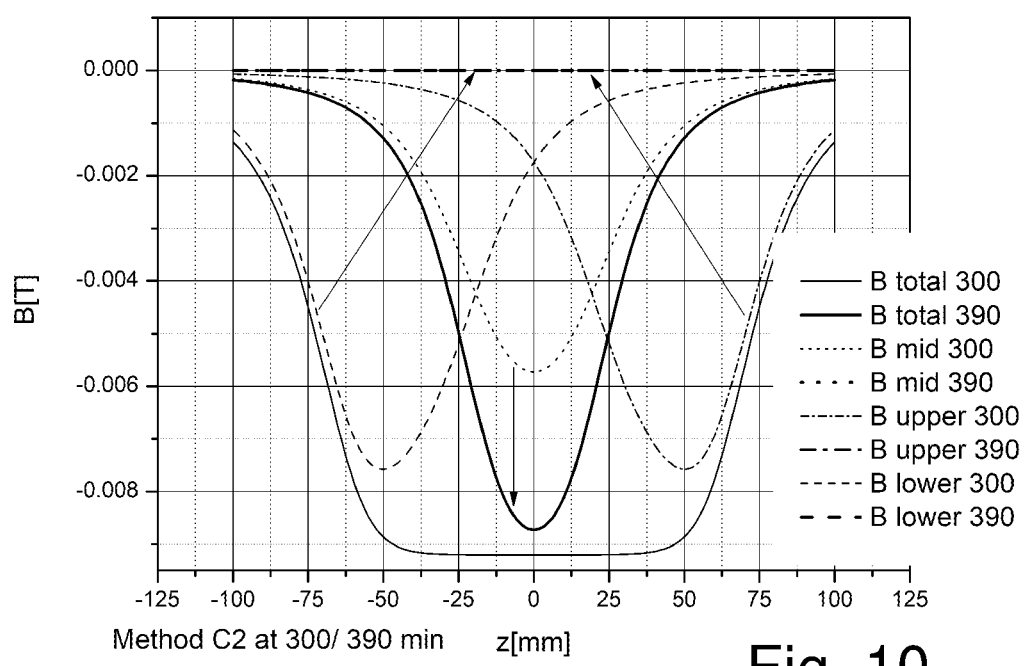
FIG. 10 illustrates schematically magnetic field contributions relating to the Method C2.

In FIG. 10, the (negative) magnetic field contributions at time point G (at 300 min) are of comparable magnitude for all bulk sub-magnets. However, at time point I (at 390 min), the magnetic field contributions of the upper and lower (axially outer) bulk sub-magnets have vanished to zero, and only an increased in magnitude, negative magnetic field contribution of the mid bulk sub-magnet remains. Again, this is well suited for compensating for a too large magnetic field contribution of the mid bulk sub-magnet in the basic distribution scheme of the main field cooling step.

Method D

Figure 11:
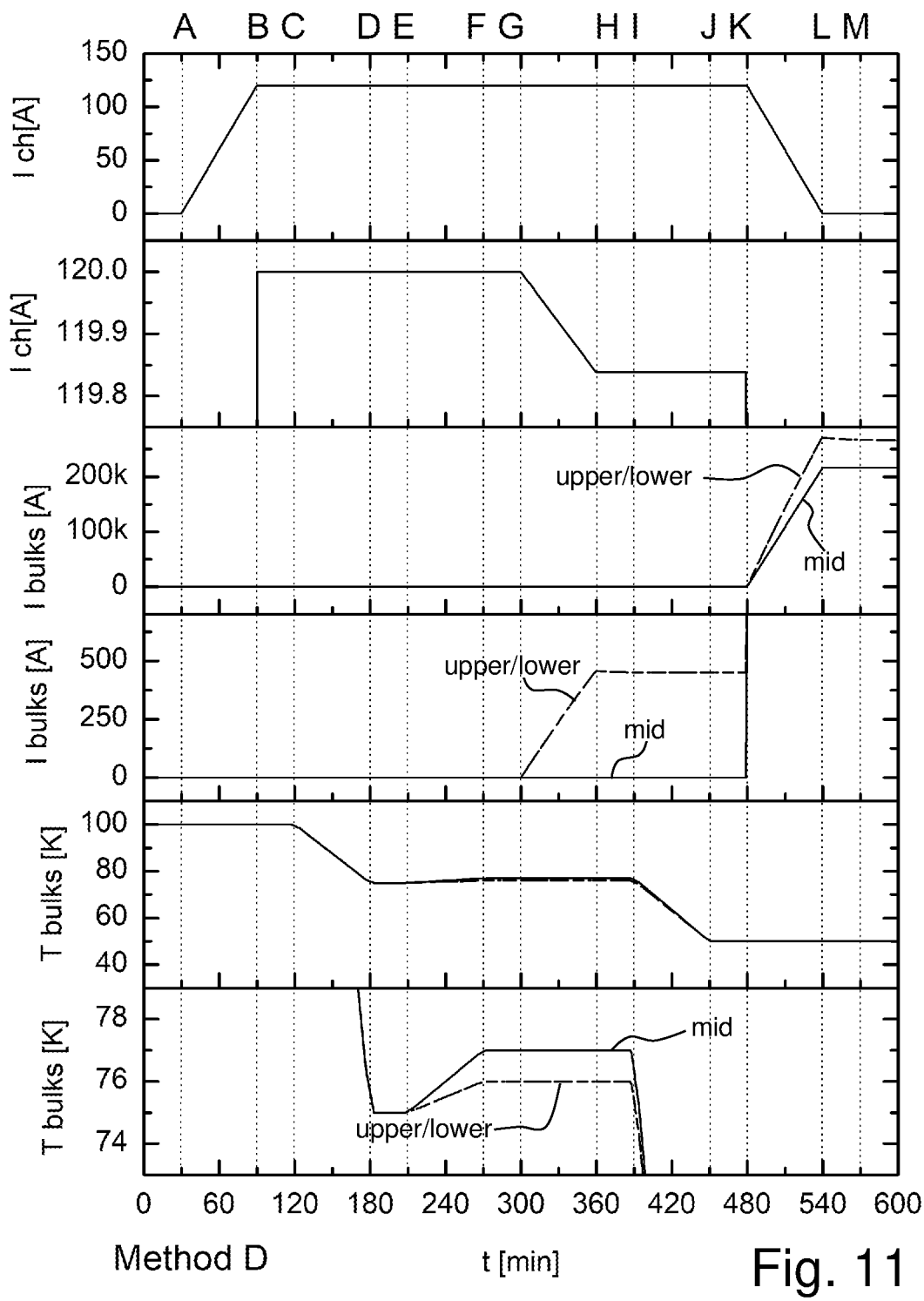
FIG. 11 shows a schematic time schedule for a variant of an inventive method for charging a superconductor magnet system (Method D)

In the variant of Method D shown in FIG. 11 (which strongly resembles Method A), the charger current I ch is ramped up to about 120 A in time interval A-B with the bulk sub-magnets still at a temperature of 100 K above their critical temperature Tcrit. In time interval C-D, the temperatures T bulks of the bulk sub-magnets are lowered uniformly to about 75 K, and in time interval E-F, different temperatures T bulks are set, with the temperature of the mid bulk sub-magnet at about 77 K, and the temperature of the upper and lower bulk sub-magnets a little lower at about 76 K at time point F.

Then in time interval G-H, the charger current I ch is slowly ramped down. Due to its higher temperature and the already present background field of the charger magnet, the mid bulk sub-magnet is immediately magnetically saturated, so practically no electric current is induced in the mid bulk sub-magnet. In contrast, in the upper and lower bulk sub-magnets, due to their lower temperature, some electric current is gradually induced. During ramping down the charger current I ch, the currently reached magnetic field profile ("intermediate magnetic field profile") is repeatedly measured. When the intermediate magnetic field profile has reached a desired characteristic (in particular a desired homogeneity), ramping down the charger current I ch is stopped, compare time point H, and the bulk sub-magnets have assumed their preparatory currents. Time interval H-I is a waiting time interval only, for relaxation purposes.

Then, during time interval I-J, the temperatures of the bulk sub-magnets are lowered to 50 K. In time interval K-L, the remaining charger current I ch is ramped down to zero, and the main currents are induced in the course of the main field cooling step.

Figure 12:
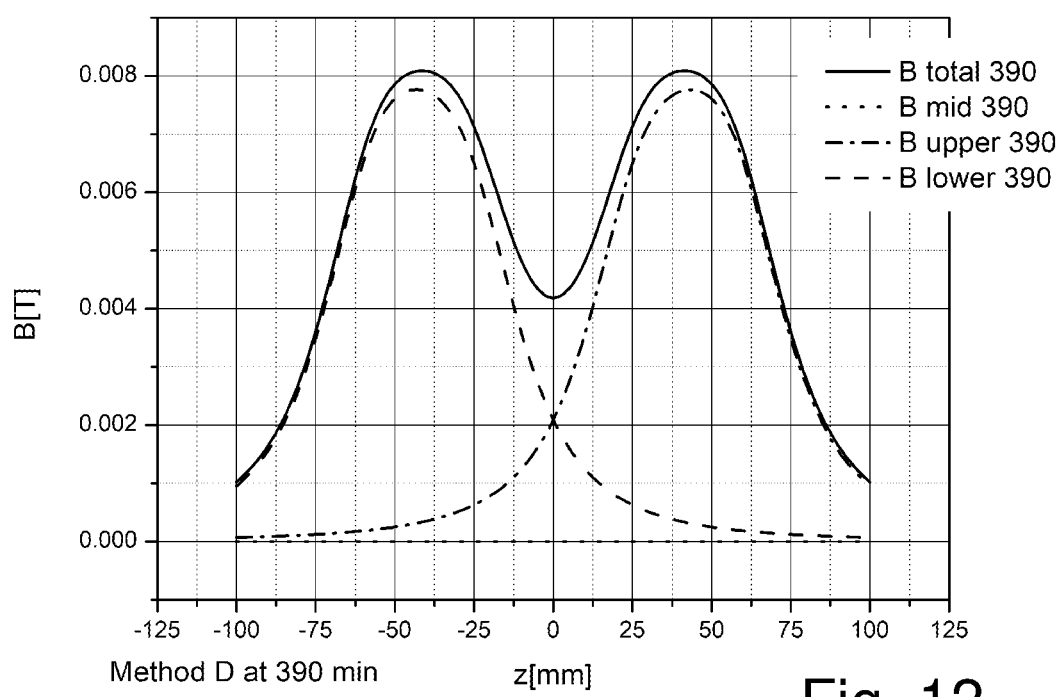
FIG. 12 illustrates schematically magnetic field contributions relating to the Method D.

As can be seen from FIG. 12, at time point I (at 390 min), again a double-hump magnetic field profile can be obtained in total, to which only the upper and lower bulk sub-magnets contribute.

Method E

Figure 13:
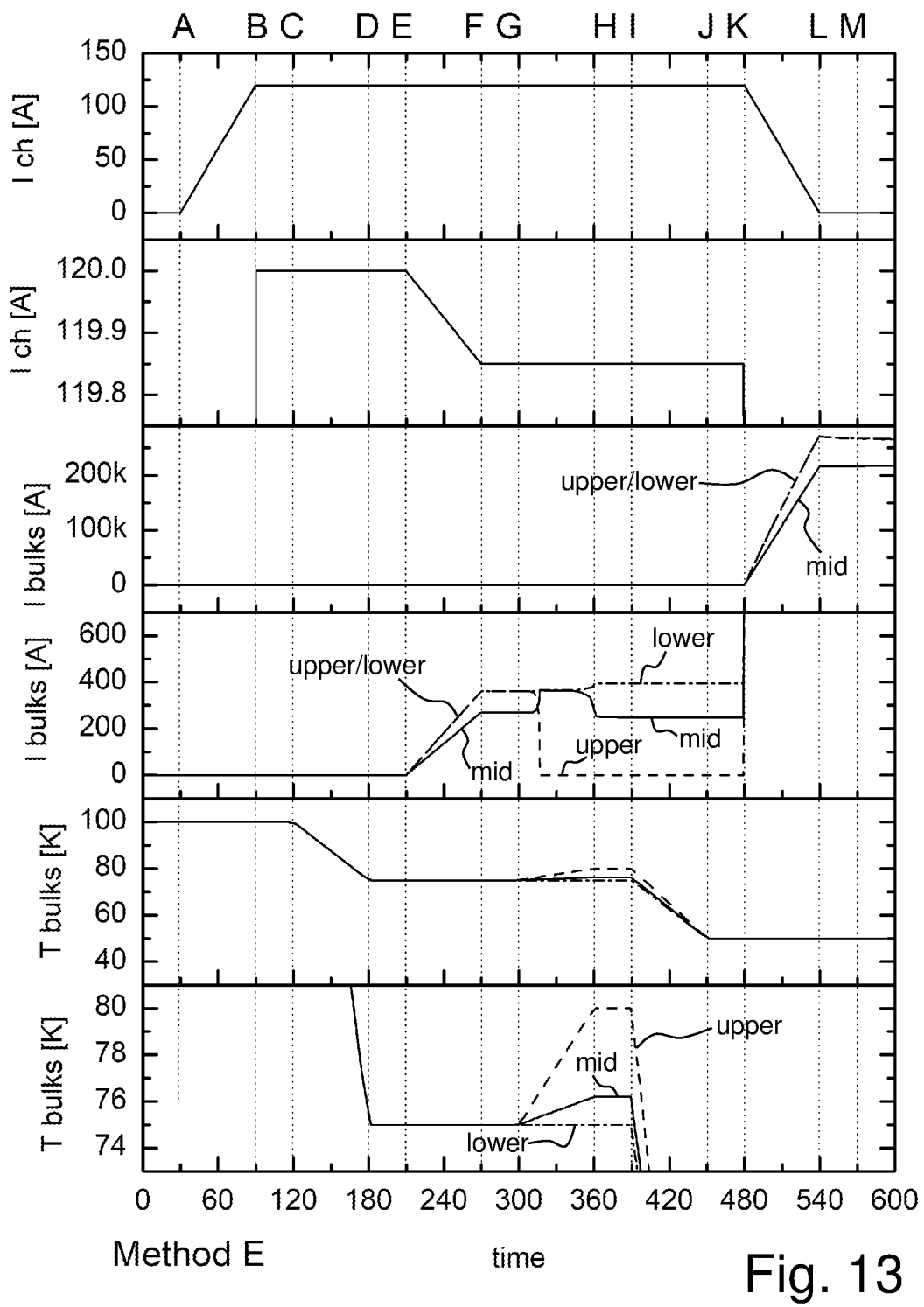
FIG. 13 shows a schematic time schedule for a variant of an inventive method for charging a superconductor magnet system (Method E)

In case of basic current distribution schemes of the main currents of the main field cooling step resulting in asymmetric magnetic field profiles (for example due to production tolerances), it is necessary to establish asymmetric preparatory currents according to a corresponding asymmetric correction scheme. Method E, illustrated in FIG. 13, shows by way of example a possibility to establish a correction scheme wherein the preparatory currents of three bulk sub-magnets are set asymmetrically with respect to the magnetic center (note that the magnetic center, at z=0, is located in the axial middle of the mid bulk sub-magnet, and the upper and lower bulk sub-magnets are spaced apart from the magnetic center axially symmetrical). Method E resembles the Method B discussed above, so the following explanations are focused on the major differences.

After having ramped up the charger current I ch in time interval A-B with the bulk sub-magnets being at temperatures T bulks of 100 K still, then the temperatures T bulks of the bulk sub-magnets are reduced uniformly to about 75 K in time interval C-D. In time interval E-F, the charger current I ch is ramped a little form about 120.0 A to about 119.84 A. This induces some bulk currents, namely about 290 A in the mid bulk sub-magnet, and about 350 A in the upper and lower bulk sub-magnets.

Then the temperatures T bulks of the three bulk sub-magnets are split in time interval G-H: The temperature of the upper bulk sub-magnet is raised with a large gradient from 75 K up to about 80 K, whereas the temperature of the mid bulk sub-magnets is raised with a small gradient form 75 K to about 76.3 K, and the temperature of the lower bulk sub-magnet is kept constant at 75 K here.

As soon as the temperature of the upper bulk sub-magnet reaches about 76.2 K (at about 320 min), it is magnetically saturated, and further increase of the temperature leads to a quick complete collapse of its current carrying capacity. The bulk current I bulk of the upper bulk sub-magnet quickly drops to zero. Some of its magnetic flux and corresponding current is taken over, for the time being, by the mid bulk sub-magnet, whose bulk current I bulk rises from about 290 A to about 350 A.

However, as soon as the temperature of the mid bulk sub-magnet reaches about 76 K at about 340 min, it also becomes magnetically saturated. Further increase of its temperature decreases its current carrying capacity, but since the temperature only increases to about 76.3 K until time point H, the current carrying capacity of the mid bulk sub-magnet is only reduced, but does not collapse completely until time point H. At time point H, the bulk current I bulk of the mid bulk sub-magnet has dropped from 350 A to about 270 A. In turn, the lower bulk sub-magnet takes over some of the magnetic flux and corresponding current, so the bulk current I bulk of the lower bulk sub-magnet rises from about 350 A at 340 min to about 400 A at point H (360 min).

By choosing different temperature gradients of the upper and mid bulk sub-magnet, these bulk sub-magnets have assumed magnetic saturation at different points of time within time interval G-H.

At time point H, or after relaxation at time point I (at 390 min), the preparatory currents have been set.

In time interval I-J, the temperatures T bulks of the bulk sub-magnets are decreased to 50 K, and in time interval K-L, the charger current is reduced to zero, what induces the main currents in the bulk sub-magnets, which add up to the preparatory currents.

Figure 14:
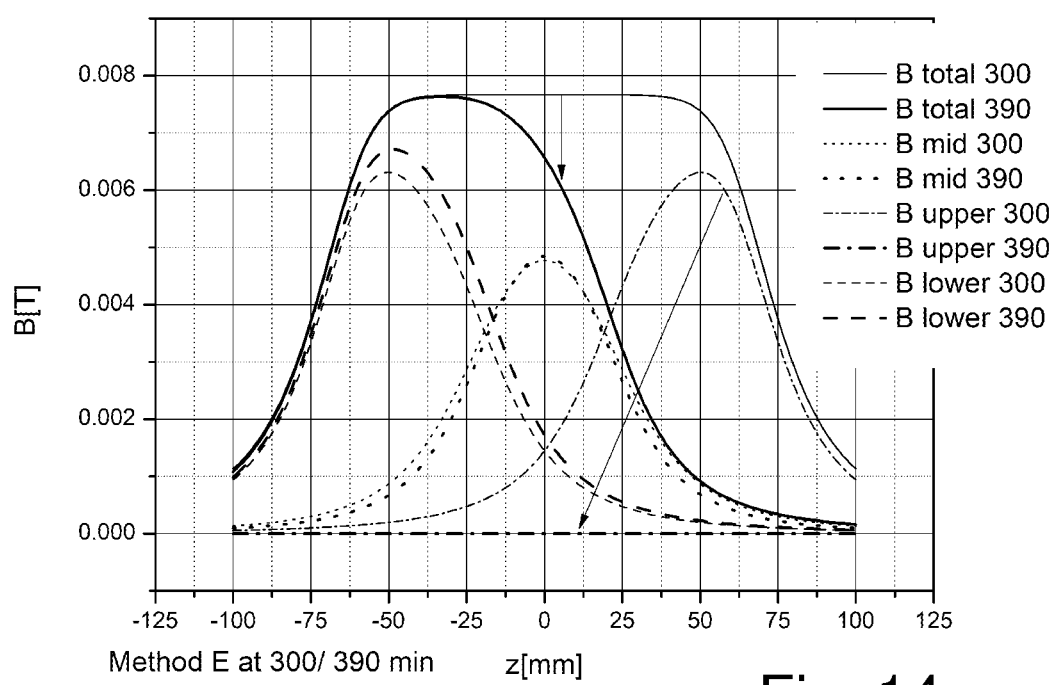
FIG. 14 illustrates schematically magnetic field contributions relating to the Method E.

FIG. 14 illustrates the magnetic field contributions of the bulk sub-magnets at time point G (at 300 min), wherein the bulk sub-magnets have been charged according to the basic distribution scheme, resulting in about equal contributions for all bulk sub-magnets. After the redistribution of the currents by application of the different temperatures (and temperature gradients) at the bulk sub-magnets, at time point I (390 min), the magnetic field contribution of the lower bulk sub-magnet has significantly increased, the magnetic field distribution of the mid bulk sub-magnet has slightly decreased, and the magnetic field distribution of the upper bulk sub-magnet has vanished. The resulting total magnetic field distribution is asymmetric with respect to z=0 (z=0 marks the magnetic center of the superconductor magnet system) here, to compensate for a (reversely) asymmetric magnetic field profile resulting from main currents according to a correspondingly asymmetric basic distribution scheme.

Method F

Figure 15:
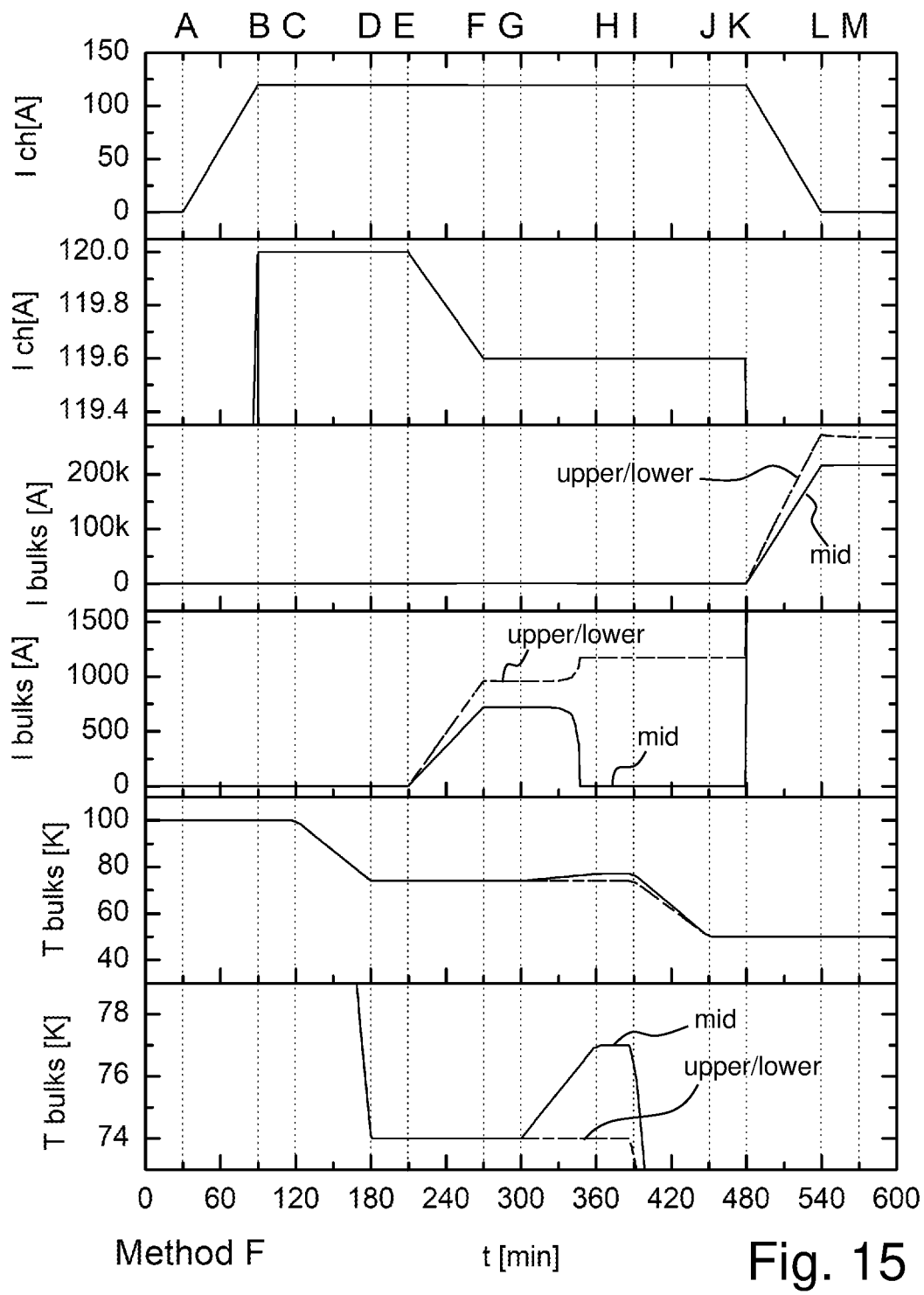
FIG. 15 shows a schematic time schedule for a variant of an inventive method for charging a superconductor magnet system (Method F)

Method F, illustrated in FIG. 15, resembles strongly the Method B illustrated above, so above all the major differences are explained. In Method F, in time interval E-F, the amplitude of current change of the charger current I ch is from about 120.0 A to about 119.6 A, and is therefore significantly larger as compared to Method B. Accordingly, the induced bulk currents I bulk at point of time F are significantly larger as compared to Method B, with the bulk current I bulk of the upper and lower bulk sub-magnet having increased to about 900 A, and the bulk current I bulk of the mid bulk sub-magnet to about 700 A. After having raised the temperatures T bulk of the mid bulk sub-magnet from 74 K to about 77 K in time interval G-H, the bulk current I bulk of the mid bulk sub-magnet has dropped to zero for lack of current carrying capacity at this temperature and in the present background field of the charger magnet, and the bulk currents I bulk of the upper and lower bulk sub-magnets, having taken over some magnetic flux and corresponding current, have increased to about 1200 A. At point of time H, or after relaxation at time point I, the preparatory currents have been set.

Figure 16:
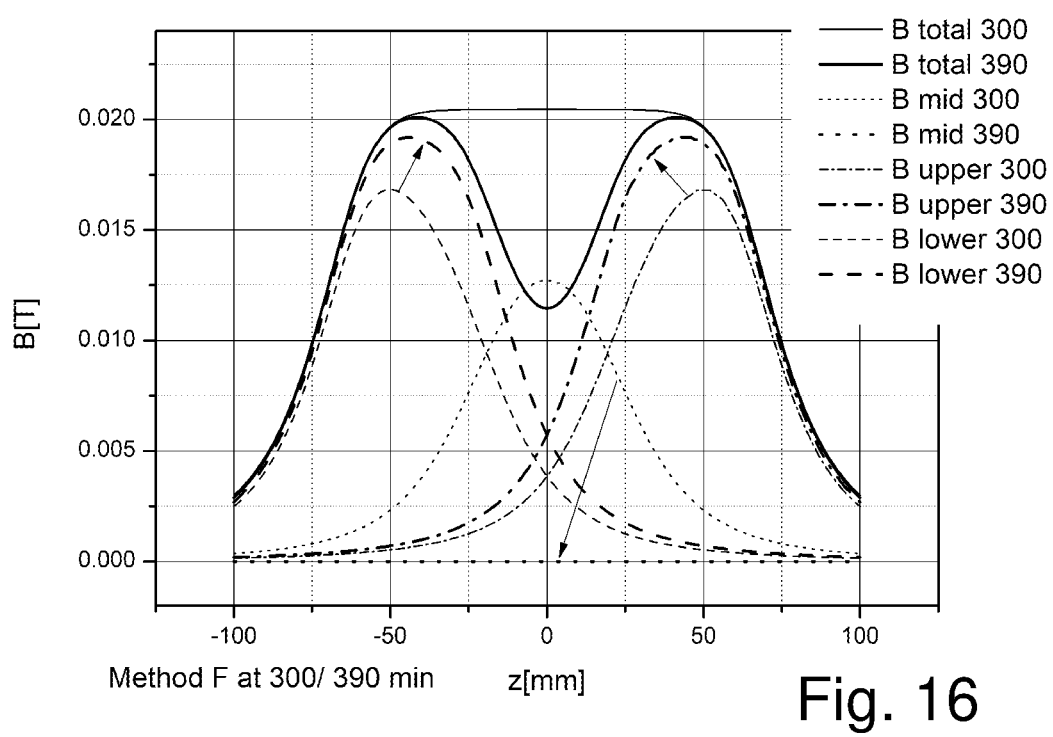
FIG. 16 illustrates schematically magnetic field contributions relating to the Method F.

FIG. 16 illustrates the magnetic field contributions of the bulk sub-magnets of Method F at points of time G at 300 min at I at 390 min; the only difference to FIG. 8 of Method B is that in FIG. 16 in Method F, the amplitude of the magnetic field contributions of the upper and lower bulk sub-magnets are much larger as compared to Method B by a factor of about 2.5. This large amplitude is enough to compensate for on-axis magnetic field gradients (of the basic distribution scheme) of second order (quadratic order) or even higher order.

Method G

Figure 17:
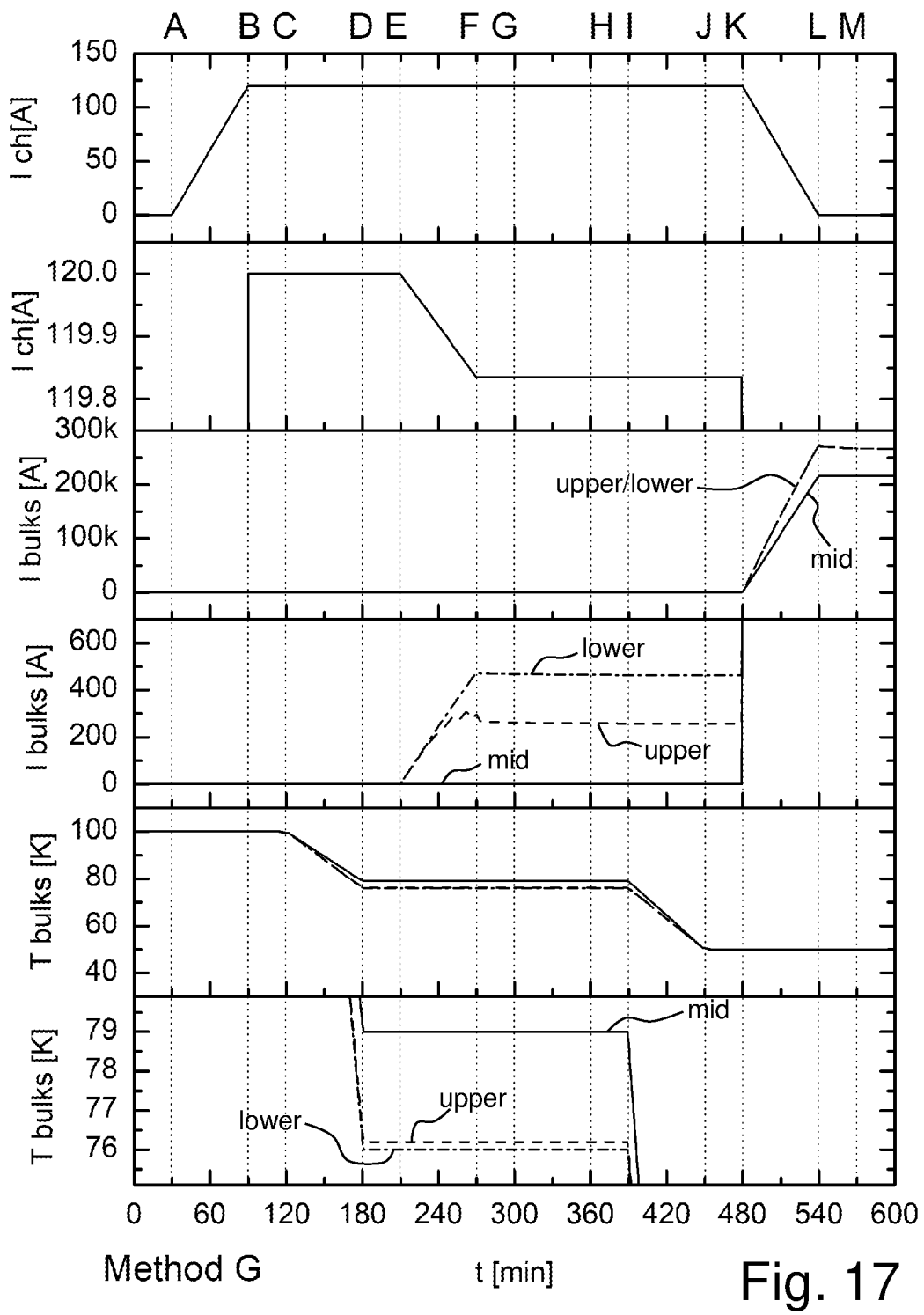
FIG. 17 shows a schematic time schedule for a variant of an inventive method for charging a superconductor magnet system (Method G)

Method G, illustrated in FIG. 17, is another example of how to establish preparatory currents according to an asymmetric correction scheme, and to set here three preparatory currents differently and individually. Method G resembles method A, so only the major differences are explained.

After ramping up the charger current I ch in time interval A-B to 120 A with the bulk sub-magnets at 100 K, in time interval C-D, the three bulk sub-magnets are cooled down to individual bulk temperatures T bulks. The mid bulk sub-magnet is cooled down to about 79 K, the upper bulk sub-magnet to about 76.2 K, and the lower bulk sub-magnet to about 76.0 K.

When in time interval E-F from 210 min to 270 min, the charger current I ch is ramped down from 120.0 A to about 119.84 A, the mid bulk sub-magnet is magnetically saturated right from the beginning due to its relatively high temperature of 79 K and the present background magnetic field of the charger magnet, and practically no bulk current I bulk is induced in the mid bulk sub-magnet.

On the other hand, between 210 min and 270 min, some bulk currents I bulks are induced both in the upper and the lower bulk sub-magnet.

However, at about 240 min, the upper bulk sub-magnet at 76.2 K becomes magnetically saturated, too, and cannot carry any further electric current. Its induced bulk current I bulk remains at about 290 A between 240 min and 270 mm min (note that there is a slight overshooting that quickly relaxes, though). From the point of time at 240 min on, the lower bulk sub-magnet at 76.0 K is the only bulk sub-magnet left which is not yet magnetically saturated, and its bulk current I bulk increases up to about 490 A until point of time F at 270 min is reached.

At point of time F, or after further relaxation at point of time I at 390 min, the preparatory currents have been set.

In time interval I-J, the temperatures T bulks of the bulk sub-magnets are lowered to about 50 K, and in time interval K-L the remaining charger current I ch is ramped down, and the main currents are induced, on top of the preparatory currents.

Figure 18:
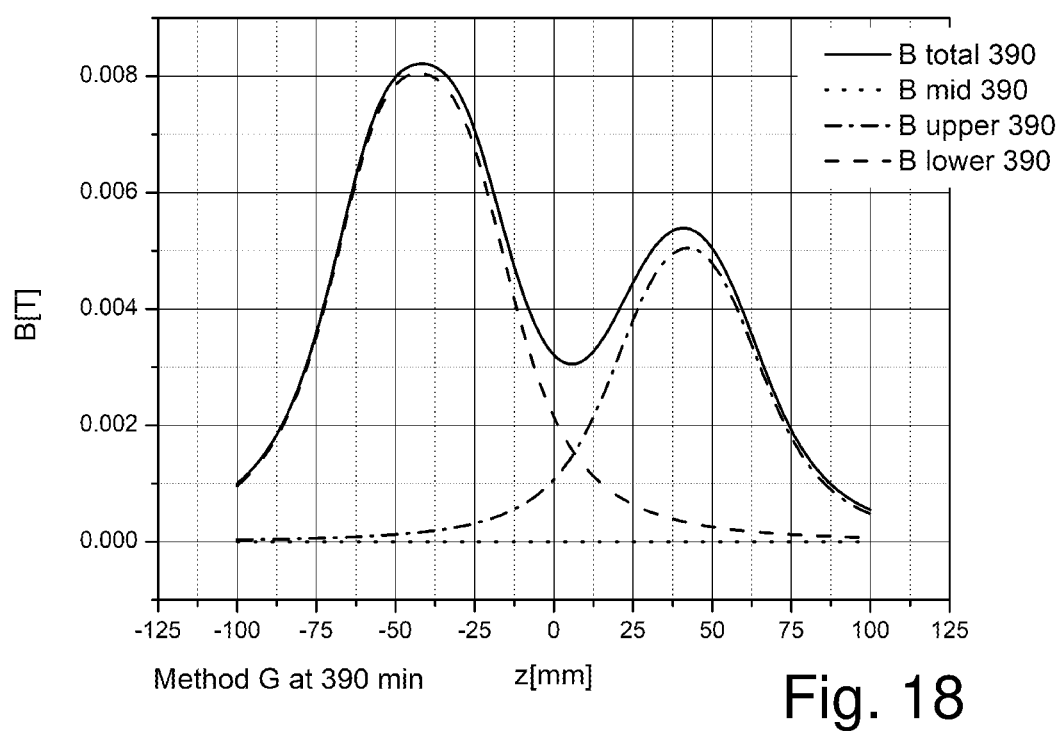
FIG. 18 illustrates schematically magnetic field contributions relating to the Method G.

As shown in FIG. 18, illustrating the magnetic field contributions of the bulk sub-magnets with the preparatory currents, the contribution of the lower bulk sub-magnet is significantly larger as compared to the contribution of the upper bulk sub-magnet, and the mid bulk sub-magnet has no contribution. The preparatory currents of Method G are well suited for compensating both an asymmetry of the contributions of the lower and upper bulk sub-magnets and a too large contribution of the mid bulk sub-magnet of a magnetic field profile based on the main currents of a basic distribution scheme.

Method Zero

Figure 19:
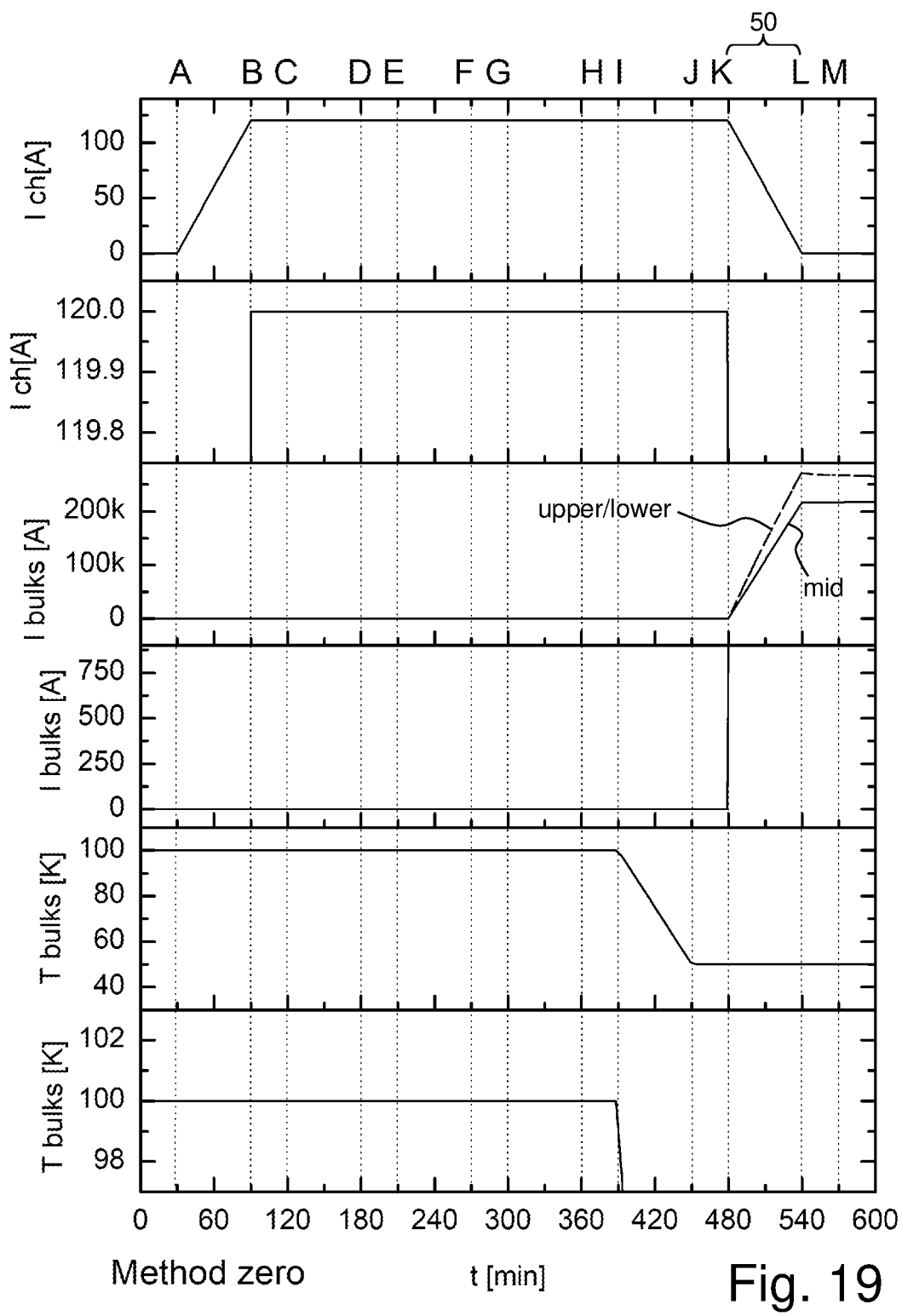
FIG. 19 shows a schematic time schedule for conventionally charging a superconductor magnet system (Method Zero), which can be used for estimating a correction scheme and preparatory currents for an inventive method for charging a superconductor magnet system.

In order to find a useful correction scheme or useful preparatory currents, respectively, first the basic distribution scheme, i.e. the current distribution in the bulk sub-magnets when conventionally charging the superconductor magnet system with the charger magnet starting from zero currents in the bulk sub-magnets, should be determined. This can be done by applying what is called here Method Zero, illustrated in FIG. 19 (for the diagrams contained, compare the explanation on FIGS. 5, 7, 9. 11. 13. 15. 17 above).

At first, in time interval A-B, the charger current I ch is ramped up here to 120 A, with the bulk sub-magnets at a temperature of here 100 K, i.e. above Tcrit, so no superconducting bulk currents I bulk may be induced until then. After some relaxation time (which was chosen in the example shown somewhat longer than needed), the bulk temperatures are lowered to here 50 K in time interval I-J, which is far below the critical temperature Tcrit of the bulk sub-magnets (which is for YBCO at about 92 K). After some relaxation, then the charger current I ch is ramped down in time interval K-L, and bulk currents are induced in the bulk sub-magnets, here about 215 kA for the main bulk sub-magnet, and about 270 kA for the upper and lower bulk sub-magnet. No magnetic saturation occurs here in the bulk sub-magnets. After some relaxation time, at point of time M (at 570 min), the main currents according to the basic distribution scheme have been set. So as compared to Methods A-G described before, Method Zero comprises the main field cooling step 50 in time interval K-L, but no preparatory charging step.

Now at point of time M, the corresponding magnetic field profile may be measured, using e.g. a Hall sensor or an NMR field-probe which moves through the room temperature bore or through the sample volume of the superconductor magnet system, respectively. When knowing the basic distribution scheme, in order to find a suitable correction scheme, the basic distribution scheme can be inverted, and then corresponding preparatory currents can be calculated. Subsequently, after a thermal reset, the preparatory currents can be applied (set) in one of Methods A-G described above.

Figure 20:
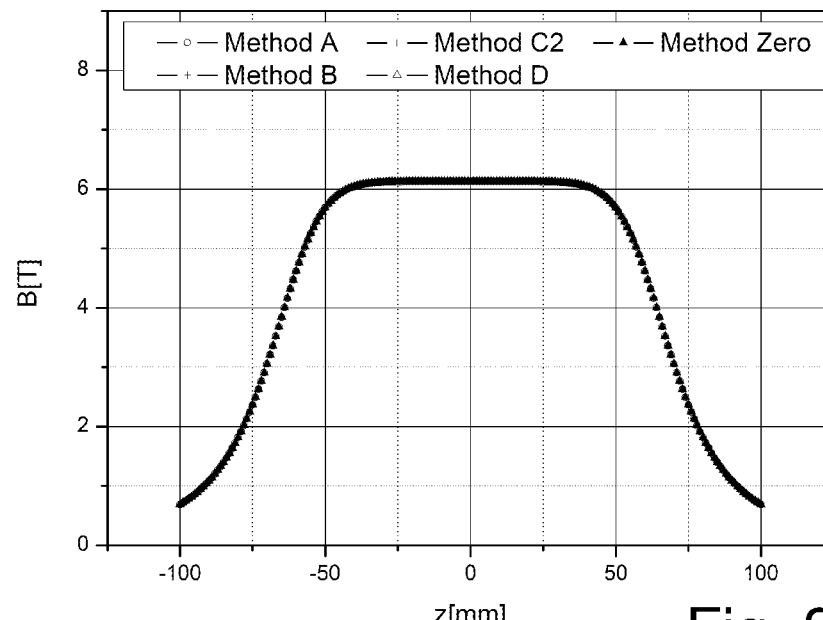
FIG. 20 shows a schematic diagram of magnetic field profiles obtained with method Zero, Method A, Method B, Method C2 and Method D.
Figure 21:
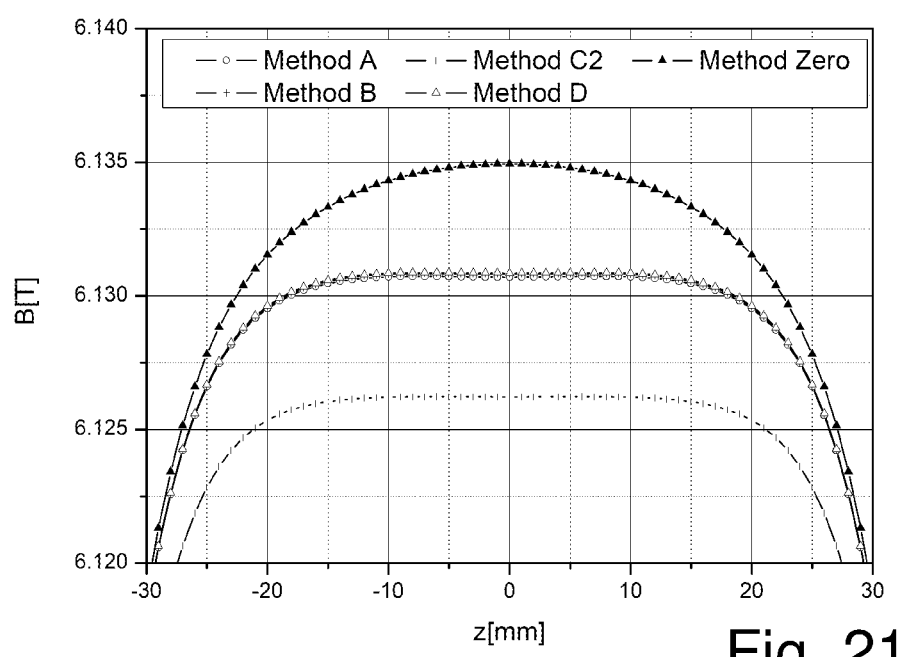
FIG. 21 shows a magnified part of FIG. 20 near the magnetic center.

FIG. 20 in an overview and FIG. 21 in a magnification illustrate the magnetic field distribution in the vicinity of the magnetic center (at z=0) in the sample volume of the superconductor magnet system after having applied various of the previously described methods. Plotted is the magnetic flux density B to the top as a function of the position along z plotted to the right.

Even for simple bulk superconductor magnet designs, the magnetic field profile obtained by conventionally charging the superconductor bulk magnet applying Method Zero only (bolt triangle markings), the magnetic field profile looks flat between about −30 mm and +30 mm, see FIG. 20, in a coarse overview. However, when magnifying the scale in particular with respect to the top axis, see FIG. 21, it can be seen that for example between −15 mm and +15 mm, B varies between about 6.133 Tesla and 6.135 Tesla, corresponding to an inhomogeneity of about 300 ppm. For many applications such as NMR applications, often a higher homogeneity is desired, typically better than 100 ppm.

This can be achieved by setting preparatory currents, which are added to the main currents resulting from a main field cooling step (as in Method Zero), and which compensate for the inhomogeneity from the main field cooling step. In the example illustrated, in Method Zero, the magnetic field is too large close to the center at z=0. This can be compensated by reducing the (overall) current in the mid bulk sub-magnet somewhat relative to the (overall) current in the upper and lower bulk sub-magnet. This can be done by setting preparatory currents as already shown for example in Methods A, B, C2 and D above.

In FIG. 21, the total magnetic field profiles, based on the bulk sub-magnets being charged with the sum of the preparatory currents (according to the correction scheme) and the main currents (according to the basic distribution scheme) are illustrated in particular for Method A (empty circles), Method B (plus signs), Method C2 (vertical bars) and Method D (empty triangles). All these magnetic field profiles are, even in the magnification of FIG. 21, practically flat between −15 mm and +15 mm, and their homogeneity is clearly better than 100 ppm in each case.

Note that for Method C2, the absolute magnetic flux is somewhat lower, since during the preparatory charging step, negative bulk currents have been induced.

Method I

Figure 22:
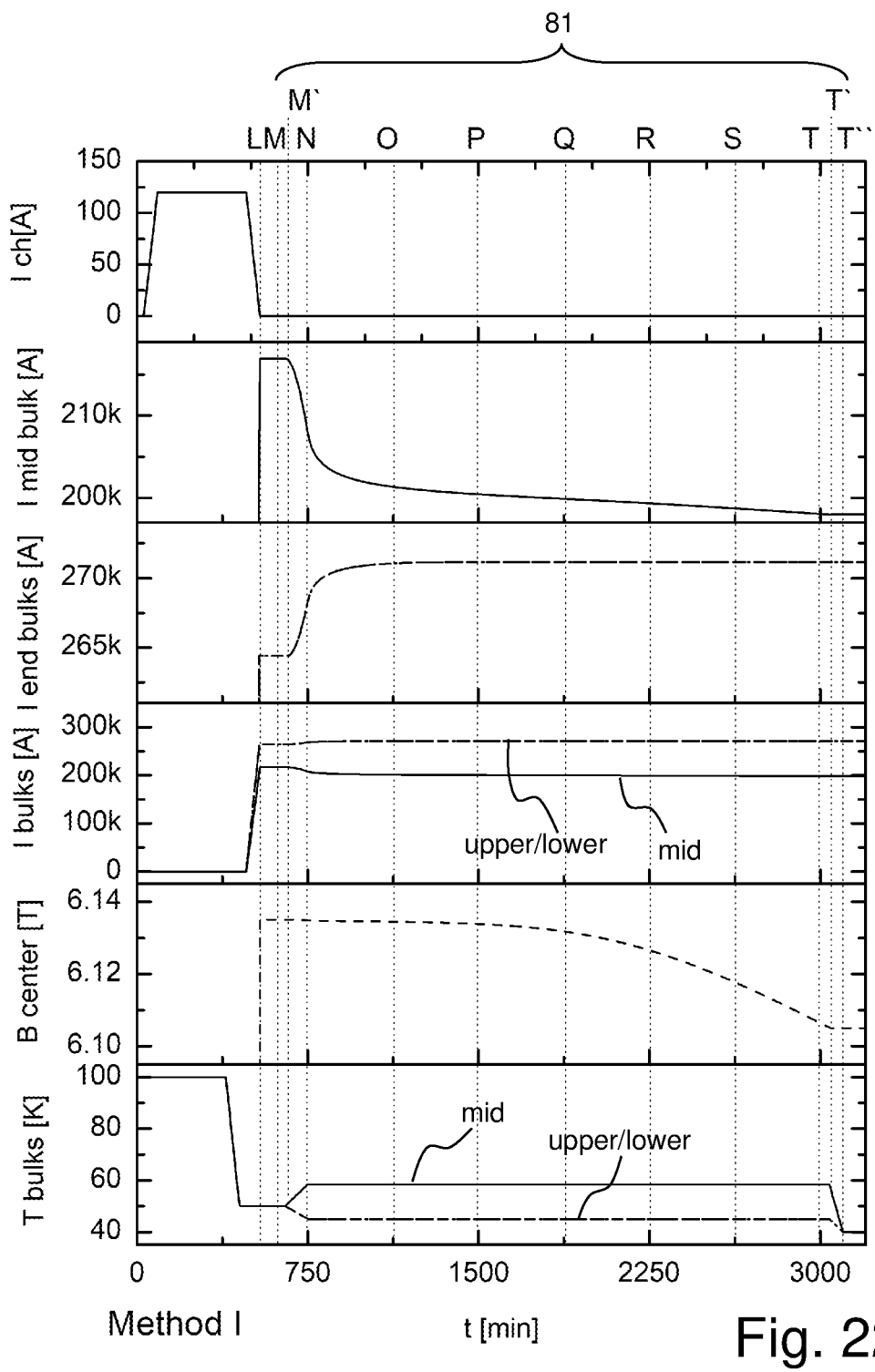
FIG. 22 shows a schematic time schedule for a variant of an inventive method for homogenizing a magnetic field profile of a superconductor magnet system (Method I)

The present invention can also be used to correct (or further correct) the magnetic field profile of a superconductor magnet system after the main field cooling step has been applied, as illustrated in FIG. 22; this is called Method I here. In general, in the course of an inventive method applying a posterior correction step, the current strengths of the individual bulk sub-magnets are only slightly altered, such that the final currents deviate typically by 10% or less from the initial currents each, and often by 5% or less.

Illustrated are, as a function of time plotted to the right, the charger current I ch (top diagram), a magnification of the current in the mid bulk sub-magnet ("I mid bulk", second to top diagram), a magnification of the current in the upper and lower bulk sub-magnet ("I end bulks", third to top diagram), an overview over the currents in the bulk sub-magnets ("I bulks", fourth to top diagram), the magnetic flux density generated by the entirety of the bulk sub-magnets at the magnetic center ("B center", second to last diagram), and the temperatures of the bulk sub-magnets ("T bulks", last diagram).

Before point of time L shown in FIG. 22, the superconductor bulk magnet has been charged by field cooling, for example using Method Zero or preferably one of the methods including a preparatory correction step as described by way of example above in Methods A through G. At point of time L, the charger current I ch reached zero. The temperatures T bulks of the bulk sub-magnets are at about 50 K at this point in time.

After switching off the charger magnet at time point L and waiting a sort relaxation time here in time interval LM', beginning at time point M' the temperature levels of the respective bulk sub-magnets are set differently, namely here raised for the mid bulk and lowered for the end bulk sub-magnets to initiate the desired redistribution of currents in the bulks. When the mid bulk sub-magnet reaches about 52 K here, it reaches magnetic saturation, and further increase in temperature up to 59 K reduces its superconducting current carrying capacity, and its current drops from about 218 kA to about 207 kA when reaching time point N. In turn, the upper and lower bulk sub-magnets take over some of the magnetic flux and corresponding electric current, and their currents increase from about 264 kA to about 269 kA until time point N, where they reach a temperature of about 45 K. It may be noted here that the redistribution of the currents due to the temperature changes in time interval M'N is in practice not instantaneous, such that said redistribution somewhat reaches beyond time point N, what can be considered a relaxation effect.

Beginning at about time point N, and dominating from about time point O on, the mid bulk sub-magnet shows a relatively high drift, i.e. gradual loss of its current, since it is at or very close to its magnetic saturation (above 99% of magnetic saturation). In the example shown, the current I mid bulk decreases from about 207 kA at time point N to about 198 kA at time point T. In turn, the end bulk sub-magnets can take over some of the magnetic flux or corresponding current from the mid bulk sub-magnet, and here the currents I end bulks increase from about 269 kA to about 271 kA in time interval NT.

Therefore, between time points N and T, the relative contribution of the mid bulk sub-magnet, as compared to the upper and lower bulk sub-magnets, decreases. This can be used to homogenize the magnetic field profile if initially, the relative contribution of the mid bulk sub-magnets was too high.

Over the course of the drift, the magnetic field profile is repeatedly measured (here at time points N, O, P, Q, R, S, T). As soon as the magnetic field profile has reached the desired level of homogeneity, the drift can be stopped by lowering the temperatures of the upper, lower and mid bulk sub-magnets further, such that all bulk sub-magnets are so far from magnetic saturation that drift becomes negligible (for example at 80% or less of the magnetic saturation). Here, at time point T at 3000 min, the desired field homogeneity is reached, and therefore quickly afterwards, in time interval T'-T", the temperatures of the bulk sub-magnets are lowered to about 40 K, what stops the drift in all bulk sub-magnets; note that the currents and magnetic field do not change significantly between T and T" any more.

The time interval M-T", during which the currents I bulks in the bulk sub-magnets are changed and in particular fine-tuned by drift, is also called the posterior correction step 81. During this posterior correction step, currents I mid bulk, I end bulks of the bulk sub-magnets of an initial state ("initial currents" at time point M), coming along with a low magnetic field homogeneity, are changed into currents I mid bulk, I end bulks of the bulk sub-magnets of a final state ("final currents" at time point T), coming along with a high magnetic field homogeneity. Typically, the homogeneity in the sample volume during the posterior correction step can be increased by a factor of 3 or more, often 5 or more, preferably by a factor of 10 or more, and most preferably by a factor of 20 or more.

In FIGS. 23 through 26, the time development of the magnetic field profile in the vicinity of the magnetic center at z=0 is illustrated. In each case, the magnetic flux density B is plotted to the top, and the position on the z axis is plotted to the right. As points in time, M, N, O, P, Q, R, S and T from FIG. 22 are illustrated in each case.

Figure 23:
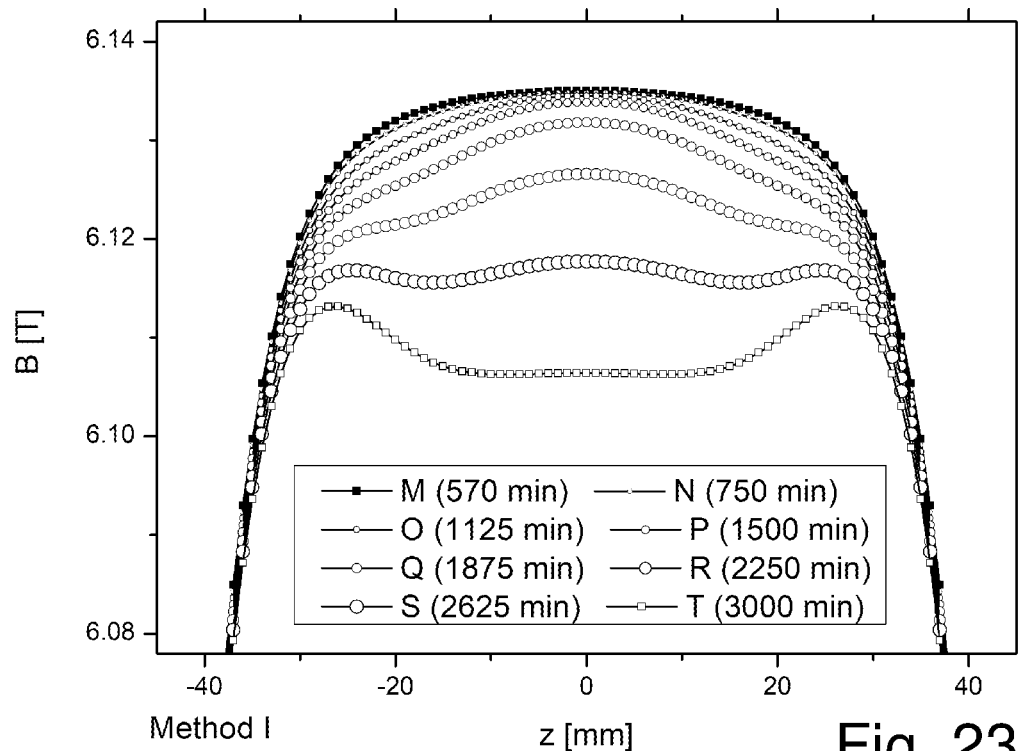
FIG. 23 shows a schematic diagram of magnetic field profiles obtained in the course of Method I, at different points of time.

FIG. 23 shows the magnetic field profile (for the entirety of the bulk sub-magnets) for the different points of time. At time point M, the magnetic field profile shows a significant inhomogeneity between −10 mm and +10 mm, with B varying between about 6.1344 Tesla and 6.1350 Tesla, corresponding to about 100 ppm. The magnetic field profile exhibits a pronounced maximum at its center, indicating that the magnetic field contribution of the mid bulk sub-magnet is too large.

Over the course of the drift between time points N and T, the overall magnetic flux density decreases somewhat, but more importantly, the homogeneity gradually increases, since the relative contribution of the mid bulk sub-magnet decreases. The final state magnetic field distribution at time point T between −10 mm and +10 mm has an inhomogeneity of less than 25 ppm here, much better than at time point M.

Figure 24:
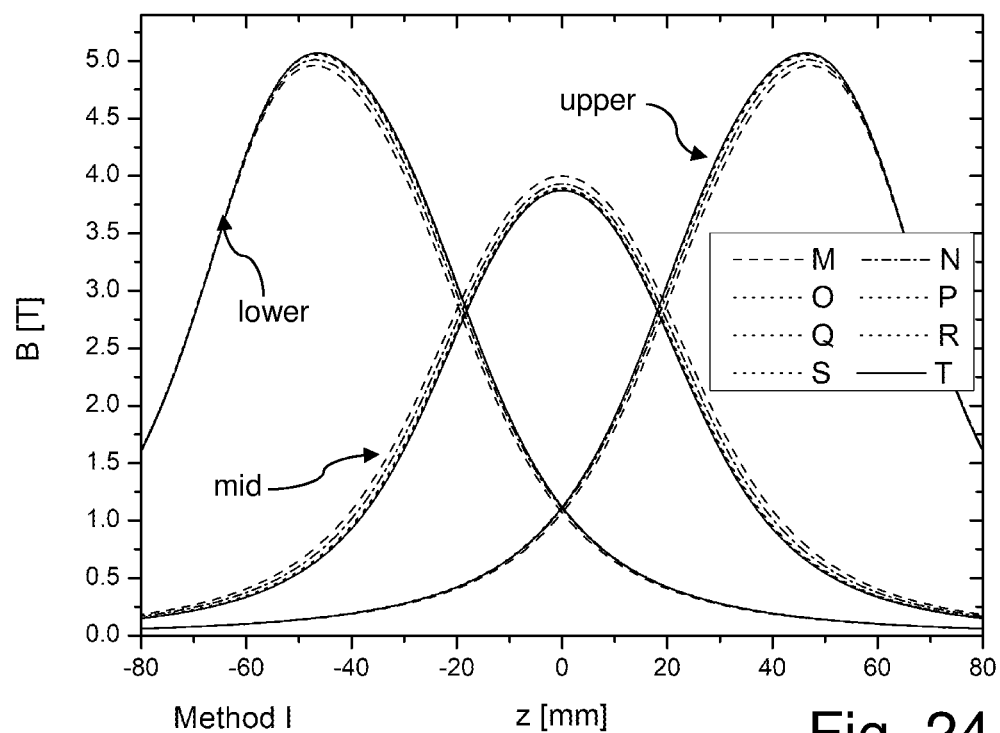
FIG. 24 illustrates schematically magnetic field contributions relating to the Method I, at different points of time, in an overview.
Figure 25:
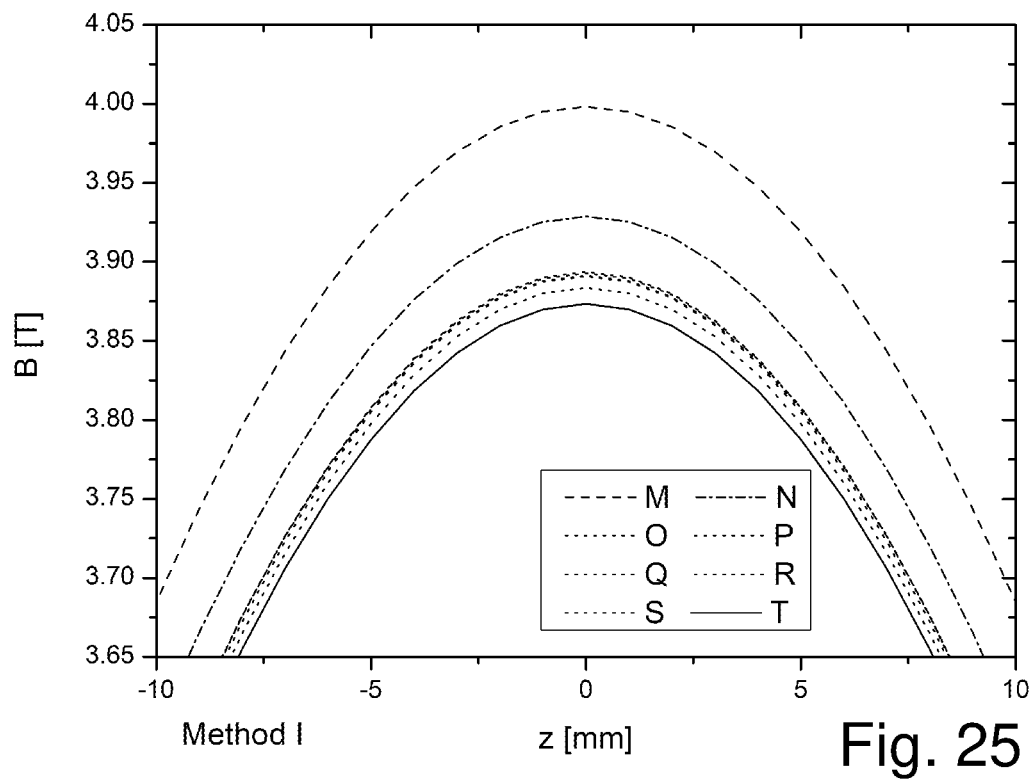
FIG. 25 shows a magnified part of FIG. 24 near the maximum of the mid bulk sub-magnet contribution.
Figure 26:
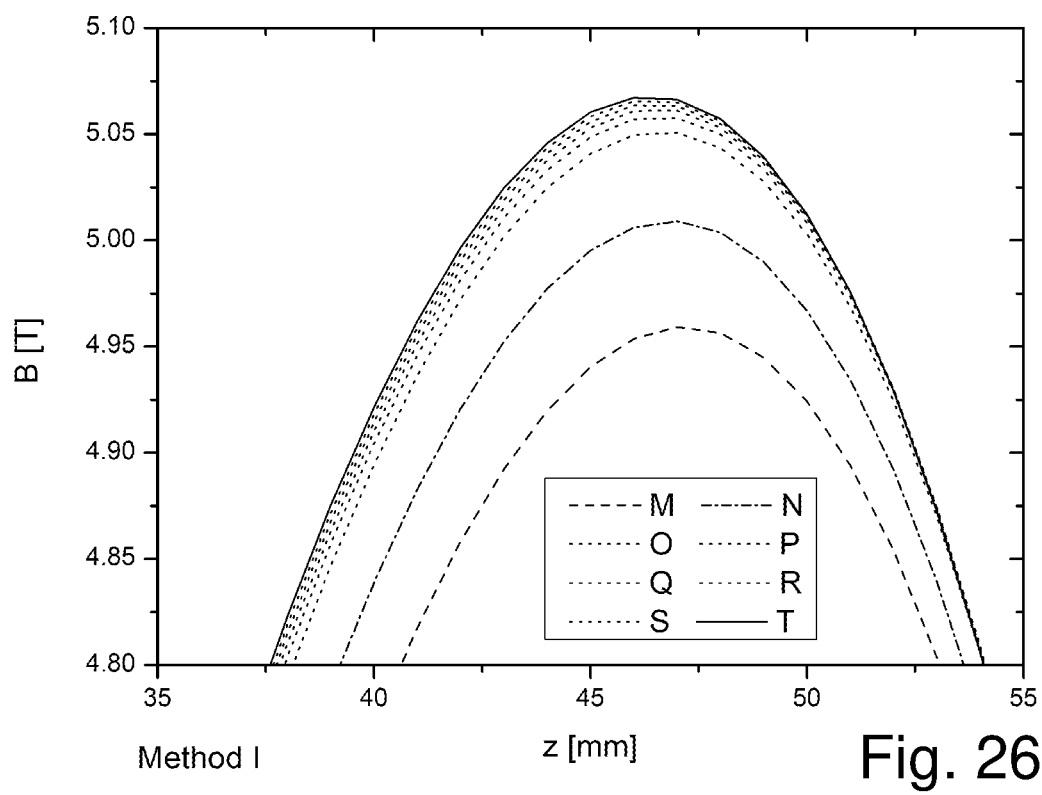
FIG. 26 shows a magnified part of FIG. 24 near the maximum of the upper bulk sub-magnet contribution.

FIG. 24 shows the time development of the contributions of the lower, mid and upper bulk sub-magnets individually. FIG. 25 shows a magnification of the mid bulk sub-magnet contribution, and FIG. 26 a magnification for the upper bulk sub-magnet contribution. As can be seen, the lower and upper bulk sub-magnet contributions slowly increase over time from M to T, taking over some magnetic flux and corresponding current from the drifting mid bulk sub-magnet. In turn, the mid bulk sub-magnet contribution slowly decreases over time from M to T, due to current loss caused by drift.

Figure 27:
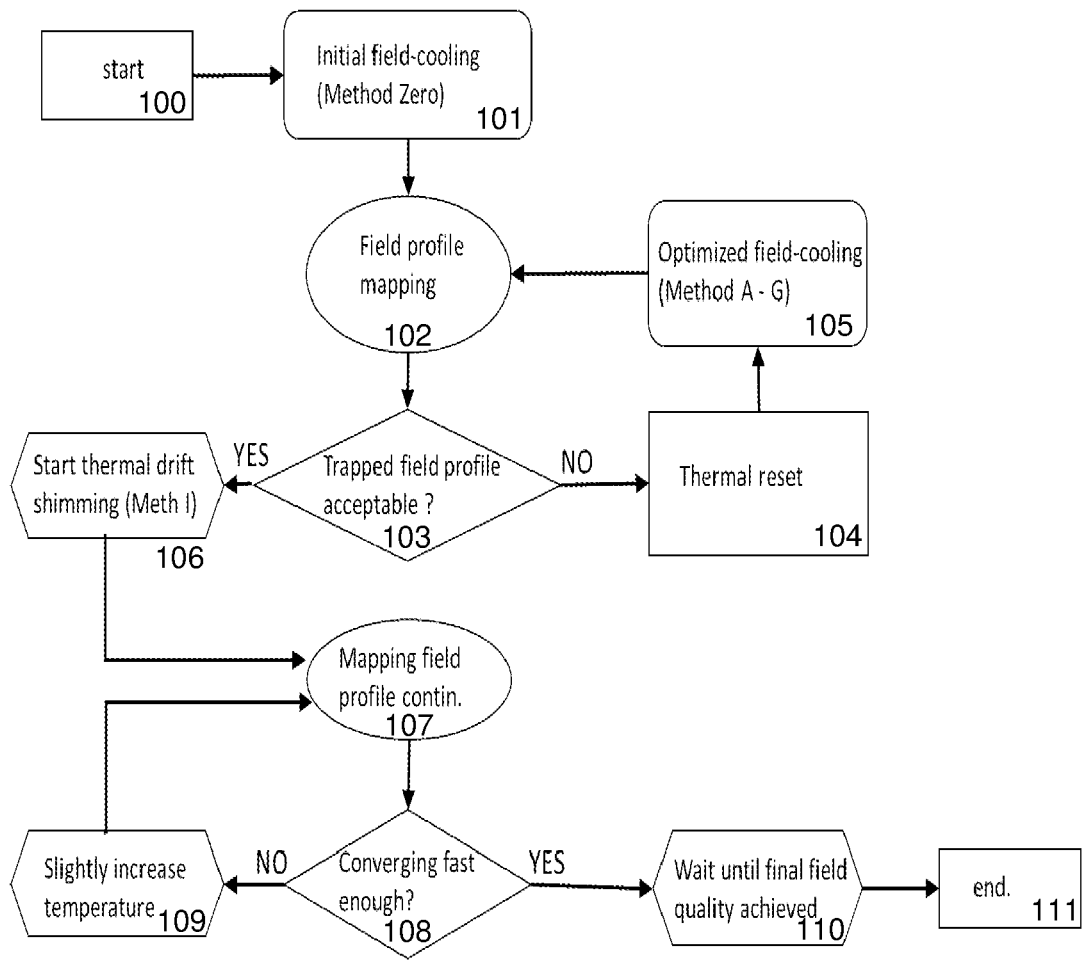
FIG. 27 shows a schematic diagram for an embodiment of an overall charging procedure of a superconductor magnet system, in accordance with the invention.

FIG. 27 shows a schematic flow diagram of a total charging and homogenization procedure of an inventive superconductor magnet system, in accordance with an embodiment of the invention.

The procedure, after the start 100, includes first an initial field cooling step according to Method Zero 101. This means that main currents according to a basic distribution scheme are induced in the bulk sub-magnets, according to the intrinsic characteristics of the charger magnet and the superconductor magnet system. The resulting magnetic field profile is then mapped 102, and evaluated in a step 103.

If the magnetic field profile is not acceptable with respect to its homogeneity in the sample volume, what is typically the case directly after Method Zero, a thermal reset 104 is done, i.e. the superconductor bulk magnet is discharged and warmed above its critical temperature again. Then, with the knowledge of the inhomogeneity obtained in the charging step (here step 101) before, an optimized field cooling 105 is done including a preparatory charging step, e.g. in accordance with one of the Methods A through G described above. After that, the magnetic field profile is mapped again 102, and evaluated 103. In case the trapped field profile is still not acceptable, another thermal reset 104 and another optimized field cooling step 105 may be included, as often as necessary.

If the magnetic field profile is acceptable, a thermal drift shimming 106 is begun, i.e. a homogenization using a posterior correction step is started, for example according to Method I. The magnetic field profile is repeatedly mapped 107 and evaluated with respect to convergence 108.

If the magnetic field profile does not converge fast enough towards the desired magnetic field profile (in particular taking into account a desired homogeneity), the temperature of one or a plurality of bulk sub-magnets is slightly increased 109, in particular to increase drift in these bulk sub-magnets. It should be noted here that if the magnetic field profile converges in an undesired direction, one or more temperatures of bulk sub-magnets may be changed in step 109, including both temperature increases and temperature reductions, too. The mapping of the field profile is continued 107 and the evaluation of convergence 108 repeated, and if necessary, further alteration steps 109 changing the temperature distribution within the bulk sub-magnets may be included.

If the magnetic field profile converges fast enough towards the desired magnetic field profile, and the time necessary until the desired magnetic field profile is reached 110, the temperatures of all bulk sub-magnets are reduced far enough such that no significant drift occurs any more, and the procedure finally ends 111. The superconductor magnet system is now ready for applications, such as doing NMR experiments in the trapped magnetic field.

LIST OF REFERENCE SIGNS 1 charging arrangement
2 superconductor magnet system
3 electric charger magnet
3a charger bore
4 cryostat
5 superconductor bulk magnet
6a upper bulk sub-magnet
6b mid bulk sub-magnet
6c lower bulk sub-magnet
7a-7b intermediate body
7c further intermediate body
8 common cooling stage
9 superconductor bore
10 room temperature bore
11 sample volume
12 cryogenic cooling system
13a-13c adjustment units
14a-14c heater elements
15a-15c thermal impedances
16a-16c temperature sensors
17 first cryocooler
17a cryocooler cold stage (first cryocooler)
18 thermal impedance
19 port
20 supply lines
21 second cryocooler
21a cryocooler cold stage (second cryocooler)
22 auxiliary cryostat
23 auxiliary supply lines
24a-24c metallic ring (corset ring)
25 hole (bulk sub-magnet)
25a hole (intermediate body)
26 further metallic ring (support ring)
27 notch
28 heater windings
29 recess
50 main field cooling step
51 preparatory charging step
61 first phase
62 second phase
100 start
101 initial field cooling (Method Zero)
102 mapping of magnetic field profile
103 evaluation of field profile
104 thermal reset
105 optimized field cooling (Methods A-G)
106 start thermal drift shimming (Method I)
107 repeated mapping of magnetic field profile
108 evaluation of convergence
109 temperature adjustment
110 waiting time
111 end
A central axis
OR outer radius
RT radial thickness

What is claimed is:

1. A superconductor magnet system, comprising:
a cryostat having a room temperature bore,
a superconductor bulk magnet, contained in the cryostat and arranged coaxially with the room temperature bore, and
a cryogenic cooling system adapted for cooling the superconductor bulk magnet, wherein the superconductor bulk magnet comprises:
at least N axially stacked bulk sub-magnets, with N≥3, wherein the bulk sub-magnets are at least substantially ring shaped and arranged coaxially with the room temperature bore,
a plurality of intermediate bodies, each respectively arranged between two of the axially neighboring bulk sub-magnets,
wherein the intermediate bodies are each at least substantially ring-shaped and arranged coaxially with the room temperature bore,
and wherein the bulk sub-magnets are supported on respective ones of the intermediate bodies,
wherein the intermediate bodies are made from a non-metallic thermal insulator material, having a specific thermal conductivity smaller than a specific thermal conductivity of the material of the bulk sub-magnets,
wherein the cryogenic cooling system is adapted to control respective temperatures of each of the bulk sub-magnets independently of one another,
and wherein the cryogenic cooling system comprises, for each of the bulk sub-magnets:
a respective temperature sensor configured to sense the temperature of the respective bulk sub-magnet, and
a respective adjustment unit configured to adjust a heating power and/or a cooling power at the respective bulk sub-magnet.

2. A superconductor magnet system according to claim 1, wherein the cryogenic cooling system further comprises:
for each of the bulk sub-magnets:
a respective heater element thermally connected to the respective bulk sub-magnet.

3. A superconductor magnet system according to claim 2, wherein each of the respective heater elements is an electric heater element.

4. A superconductor magnet system according to claim 2, wherein the respective heater elements each comprise at least one heater winding wound around a respective one of the bulk sub-magnets.

5. A superconductor magnet system according to claim 4, wherein the cryogenic cooling system further comprises N metallic rings each respectively annularly framing a respective one of the bulk sub-magnets, and wherein the at least one heater winding is arranged in a circumferential notch of a respective one of the metallic rings.

6. A superconductor magnet system according to claim 1, wherein the cryogenic cooling system further comprises N metallic rings each respectively annularly framing a respective one of the bulk sub-magnets.

7. A superconductor magnet system according to claim 6, wherein the metallic rings each extend axially no further than a full axial height of a respective one of the bulk sub-magnets.

8. A superconductor magnet system according to claim 1, wherein the intermediate bodies are each made of a polyimide material or a glass fiber reinforced plastic material.

9. A superconductor magnet system according to claim 1, wherein
the cryogenic cooling system further comprises a common cooling stage for the bulk sub-magnets in combination, and
for each of the bulk sub-magnets, a respective thermal connection from the common cooling stage to the respective bulk sub-magnet.

10. A superconductor magnet system according to claim 9, wherein the respective thermal connections each comprise a thermal impedance.

11. A superconductor magnet system according to claim 9, wherein
the cryogenic cooling system further comprises a permanently installed first cryocooler comprising a cryocooler cold stage arranged inside the cryostat, wherein the cryocooler cold stage is connected via a thermal impedance or via a thermal switch to the common cooling stage,
and wherein the cryostat further comprises a port and supply lines for an external cooling fluid leading from the port to the common cooling stage and back.

12. A superconductor magnet system according to claim 11, wherein the first cryocooler is a pulse tube cooler, and wherein the external cooling fluid is supplied by a second cryocooler.

13. A superconductor magnet system according to claim 1, wherein a radial thickness (RT) of at least one axially inner one of the bulk sub-magnets is equal to or larger than a radial thickness (RT) of axially outer ones of the bulk sub-magnets.

14. A superconductor magnet system according to claim 13, wherein all of the bulk sub-magnets have mutually identical outer radii (OR).

15. A superconductor charging arrangement, comprising an electric charger magnet with a charger bore, and
a superconductor magnet system according to claim 1, arranged at least partially within the charger bore.

16. A method for charging a superconductor magnet system,
wherein the superconductor magnet system comprises:
a cryostat having a room temperature bore,
a superconductor bulk magnet, contained in the cryostat and arranged coaxially with the room temperature bore, and
a cryogenic cooling system adapted for cooling the superconductor bulk magnet,
wherein the superconductor bulk magnet comprises at least N axially stacked bulk sub-magnets, with N≥3, and
wherein the cryogenic cooling system is adapted for independently controlling respective temperatures of each of the bulk sub-magnets,
and wherein the superconductor magnet system is arranged at least partially within a charger bore of an electric charger magnet and is configured with the electric charger magnet according to a specific setup,
the method comprising:
a main field cooling step, wherein a charger current (I ch) of the electric charger magnet is ramped down, causing the superconductor bulk magnet to take over a magnetic flux of the charger magnet and an electric current corresponding to the flux, wherein main currents are induced in the bulk sub-magnets with relative proportions according to a basic distribution scheme for the specific setup of the superconductor magnet system and the electric charger magnet, and wherein none of the bulk sub-magnets is magnetically saturated during the main field cooling step; and
a preparatory charging step, wherein preparatory currents are set in the bulk sub-magnets, with the preparatory currents having relative proportions according to a correction scheme which is different from the basic distribution scheme,
wherein, for setting the preparatory currents according to the correction scheme, temperatures (T bulks) of at least a part of the bulk sub-magnets are selected to differ at least temporarily from each other, and at least temporarily at least a part of the bulk sub-magnets is magnetically saturated during the preparatory charging step,
wherein the main field cooling step takes place after the preparatory charging step, such that the preparatory currents and the main currents add up for the respective bulk sub-magnets, and
wherein a magnetic field profile of the superconductor bulk magnet based on the sum of the preparatory currents and the main currents is more homogenous than a magnetic field profile based on the main currents alone.

17. A method according to claim 16,
wherein, during the preparatory charging step, while at least two of the bulk sub-magnets are at different temperatures (T bulks), the charger current (I ch) of the electric charger magnet is changed such that preparatory currents are induced in the bulk sub-magnets, and
wherein during said change of the charger current (I ch) in the preparatory charging step, at least a first part of the bulk sub-magnets is or becomes magnetically saturated.

18. Method according to claim 17, wherein the first part comprises a plurality of the bulk sub-magnets, wherein at least two of the bulk sub-magnets of the first part have different temperatures (T bulks) such that the at least two bulk sub-magnets of the first part become magnetically saturated at different points in time during the change of the charger current (I ch).

19. Method according to claim 17, wherein, during said change of the charger current (I ch) of the preparatory charging step, a second part of the bulk sub-magnets does not become magnetically saturated, and the change of the charger current (I ch) continues changing the preparatory currents in the bulk sub-magnets of the second part during an entirety of the change of the charger current (I ch) in the preparatory charging step.

20. A method according to claim 16,
wherein the preparatory charging step comprises a first phase and a second phase,
wherein, in the first phase, changing the charger current (I ch) of the electrical charger magnet induces intermediate currents in the superconductor bulk magnet according to the basic distribution scheme, wherein none of the bulk sub-magnets is magnetically saturated during the first phase, and
wherein in the second phase, with the charger current (I ch) held constant, for a first part of the bulk sub-magnets, the respective temperatures (T bulks) of the bulk sub-magnets are ramped up, wherein, during said ramping-up, the bulk sub-magnets of the first part become magnetically saturated, and during further ramping-up the temperatures (T bulks) the respective intermediate currents in the magnetically saturated bulk sub-magnets of the first part are reduced in magnitude down to the preparatory currents.

21. A method according to claim 20,
wherein, in the second phase, the respective temperatures (T bulks) of a second part of the bulk sub-magnets are kept low enough to prevent the bulk sub-magnets of the second part from becoming magnetically saturated, wherein during said further ramping-up of the temperatures (T bulks) of the bulk sub-magnets of the first part, magnetic flux and corresponding electric current from bulk sub-magnets of the first part are at least partially taken over by bulk sub-magnets of the second part, increasing in magnitude the intermediate currents in the bulk sub-magnets in the second part to the preparatory currents.

22. A method according to claim 20, wherein the first part comprises at least two bulk sub-magnets whose temperatures (T bulks) are ramped up with different gradients, such that the at least two bulk sub-magnets become magnetically saturated at different points in time.

23. Method according to claim 16, wherein, during the preparatory charging step, an intermediate magnetic field profile of the superconductor bulk magnet is repeatedly measured, and temperatures (T bulks) of the bulk sub-magnets and/or the charger current (I ch) are repeatedly changed, until a desired magnetic field profile of the superconductor bulk magnet based on the preparatory currents and according to the correction scheme has been achieved.

24. Method according to claim 16, wherein a magnetic field profile of the superconductor bulk magnet based on the preparatory currents is asymmetric with respect to a magnetic center of the superconductor bulk magnet.

25. Method according to claim 16, wherein, after the preparatory charging step and the main field cooling step, the bulk sub-magnets are in an initial state, and wherein, in the initial state, the bulk sub-magnets carry respective initial currents with relative proportions according to an initial distribution scheme, said method further comprising a posterior correction step which changes the initial currents into final currents with relative proportions according to a final distribution scheme which is different from the initial distribution scheme, wherein a magnetic field profile of the superconductor bulk magnet based on the final currents is more homogenous than a magnetic field profile based on the initial currents, and wherein, for changing the initial currents into the final currents, the temperatures (T bulks) of at least a part of the bulk sub-magnets are selected to differ at least temporarily from each other, such that for a first part of the bulk sub-magnets, the bulk sub-magnets of the first part are at least almost magnetically saturated, with at least 99% relative magnetic saturation, and for a second part of the bulk sub-magnets, the bulk sub-magnets of the second part are significantly away from magnetic saturation, with at most 95% relative magnetic saturation.

26. A method for homogenizing a magnetic field profile of a superconductor magnet system, wherein the superconductor magnet system comprises a cryostat having a room temperature bore,
a superconductor bulk magnet, contained in the cryostat and arranged coaxially with the room temperature bore, and
a cryogenic cooling system adapted for cooling the superconductor bulk magnet,
wherein the superconductor bulk magnet comprises at least N axially stacked bulk sub-magnets, with $N \geq 3$,
wherein in an initial state, the bulk sub-magnets carry respective initial currents with relative proportions according to an initial distribution scheme, and
wherein the cryogenic cooling system is adapted for independently controlling respective temperatures (T bulks) of each of the bulk sub-magnets, the method comprising
a posterior correction step which changes the initial currents into final currents with relative proportions according to a final distribution scheme which is different from the initial distribution scheme,
wherein a magnetic field profile of the superconductor bulk magnet based on the final currents is more homogenous than a magnetic field profile based on the initial currents,
wherein, for changing the initial currents into the final currents, the temperatures (T bulks) of at least a part of the bulk sub-magnets are selected to differ at least temporarily from each other, such that for a first part of the bulk sub-magnets, the bulk sub-magnets of the first part are at least almost magnetically saturated, with at least 99% relative magnetic saturation, and for a second part of the bulk sub-magnets, the bulk sub-magnets of the second part are significantly away from magnetic saturation, with at most 95% relative magnetic saturation.

27. Method according to claim 26, wherein the temperatures (T bulks) of the bulk sub-magnets of the first part are at least temporarily higher than the temperatures (T bulks) of the bulk sub-magnets of the second part.

28. Method according to claim 26, wherein, during the posterior correction step, an intermediate magnetic field profile is repeatedly measured until a desired magnetic field profile based on the final currents is obtained, and wherein between measurements, temperatures (T bulks) of the bulk sub-magnets are changed and/or predetermined durations of elapsed time are awaited.

29. Method according to claim 26, wherein, for assuming the initial state in a main field cooling step, the superconductor magnet system is arranged at least partially in a charger bore of an electrical charger magnet, and a charger current (I ch) of the electric charger magnet is ramped down, causing the superconductor bulk magnet to take over a magnetic flux of the charger magnet and an electric current corresponding to the flux.

\* \* \* \* \*